US010677965B2

(12) United States Patent
Chen et al.

(10) Patent No.: US 10,677,965 B2
(45) Date of Patent: Jun. 9, 2020

(54) OPTICAL APPARATUS FOR NON-VISIBLE LIGHT APPLICATIONS

(71) Applicant: Forelux Inc., Taipei (TW)

(72) Inventors: Shu-Lu Chen, Taipei (TW);
Yun-Chung Na, Zhubei (TW)

(73) Assignee: Forelux Inc., Taipei (TW)

( * ) Notice: Subject to any disclaimer, the term of this patent is extended or adjusted under 35 U.S.C. 154(b) by 178 days.

(21) Appl. No.: 15/975,534

(22) Filed: May 9, 2018

(65) Prior Publication Data

US 2018/0259684 A1 Sep. 13, 2018

Related U.S. Application Data

(63) Continuation-in-part of application No. 15/496,643, filed on Apr. 25, 2017, now Pat. No. 10,539,719,
(Continued)

(51) Int. Cl.
*G02F 1/29* (2006.01)
*G02B 3/08* (2006.01)
(Continued)

(52) U.S. Cl.
CPC .............. *G02B 3/08* (2013.01); *G02B 1/005* (2013.01); *G02B 5/188* (2013.01); *G02B 5/189* (2013.01);
(Continued)

(58) Field of Classification Search
CPC . G02B 1/005; G02B 3/08; G02B 6/32; G02B 6/4215; G02B 1/10;
(Continued)

(56) References Cited

U.S. PATENT DOCUMENTS 6,627,469 B2 * 9/2003 O'Brien .................. H01L 33/20
257/E33.068
6,802,073 B1 10/2004 Takahashi
(Continued)

FOREIGN PATENT DOCUMENTS

EP 2634605 9/2013
JP 11-072605 3/1999
(Continued)

OTHER PUBLICATIONS

JP Office Action in Japanese Appln. 2015-012381, dated Jul. 31, 2019, 7 pages.
(Continued)

*Primary Examiner* — Brandi N Thomas
(74) *Attorney, Agent, or Firm* — Fish & Richardson P.C.

(57) ABSTRACT

An optical device fabrication method includes removing semiconductor material from a semiconductor substrate to form a first curved surface and a second curved surface, forming a bonding material on the first curved surface, and selectively removing semiconductor material from at least one of the first and the second curved surfaces to form one or more subwavelength structures. The semiconductor substrate has a bandgap wavelength associated with a bandgap energy of the semiconductor material. The optical device refracts certain incident electromagnetic radiation and/or filters other electromagnetic radiation. The refracted radiation includes infrared wavelengths longer than the bandgap wavelength and the filtered radiation includes wavelengths shorter than the bandgap wavelength.

21 Claims, 12 Drawing Sheets

Related U.S. Application Data which is a continuation of application No. 14/601,737, filed on Jan. 21, 2015, now Pat. No. 9,651,718.

(60) Provisional application No. 62/503,922, filed on May 9, 2017, provisional application No. 62/086,727, filed on Dec. 3, 2014, provisional application No. 62/079,498, filed on Nov. 13, 2014, provisional application No. 62/063,426, filed on Oct. 14, 2014, provisional application No. 61/946,799, filed on Mar. 2, 2014, provisional application No. 61/932,232, filed on Jan. 27, 2014.

(51) Int. Cl.

| | | |
|---|---|---|
| G02B 5/18 | (2006.01) | |
| G02B 5/20 | (2006.01) | |
| G02B 6/124 | (2006.01) | |
| H01L 31/0232 | (2014.01) | |
| G02B 6/30 | (2006.01) | |
| G02B 26/00 | (2006.01) | |
| G02B 1/00 | (2006.01) | |
| G02B 6/12 | (2006.01) | |
| H01L 33/58 | (2010.01) | |
| G02B 1/10 | (2015.01) | |
| G02B 6/42 | (2006.01) | |
| G02B 6/32 | (2006.01) | |
| G02B 6/34 | (2006.01) | |

(52) U.S. Cl.
CPC .......... *G02B 5/1876* (2013.01); *G02B 5/203* (2013.01); *G02B 5/207* (2013.01); *G02B 5/208* (2013.01); *G02B 6/124* (2013.01); *G02B 6/30* (2013.01); *G02B 26/001* (2013.01); *G02B 26/007* (2013.01); *G02F 1/29* (2013.01); *H01L 31/0232* (2013.01); *H01L 31/02327* (2013.01); *G02B 1/10* (2013.01); *G02B 6/32* (2013.01); *G02B 6/34* (2013.01); *G02B 6/4215* (2013.01); *G02B 2006/12102* (2013.01); *G02B 2006/12107* (2013.01); *G02B 2006/12109* (2013.01); *H01L 33/58* (2013.01)

(58) Field of Classification Search
CPC .......... G02B 2006/12102; G02B 2006/12107; G02B 2006/12109; G02B 26/001; G02B 26/007; G02B 5/1809; G02B 5/1876; G02B 5/188; G02B 5/189; G02B 5/203; G02B 5/207; G02B 5/208; G02B 6/124; G02B 6/30; G02B 6/34; G02B 6/4204
USPC ....... 359/237, 242, 315, 322, 290–292, 298; 257/16, 37, 40, 52
See application file for complete search history.

(56) References Cited

U.S. PATENT DOCUMENTS

| | | |
|---|---|---|
| 7,095,484 B1 | 8/2006 | Fries |
| 9,651,718 B2 | 5/2017 | Chen et al. |
| 2003/0197906 A1 | 10/2003 | Furuta |
| 2004/0114642 A1 | 6/2004 | Bullington |
| 2005/0240341 A1 | 10/2005 | Fielhauer |
| 2006/0038182 A1 | 2/2006 | Rogers et al. |
| 2006/0056076 A1 | 3/2006 | Araki et al. |
| 2006/0198404 A1 | 9/2006 | Henrichs |
| 2007/0263973 A1 | 11/2007 | Van Laere et al. |
| 2008/0024873 A1 | 1/2008 | Kim et al. |
| 2008/0259981 A1 | 10/2008 | Wang et al. |
| 2010/0110430 A1 | 5/2010 | Ebbesen et al. |
| 2011/0204467 A1 | 8/2011 | Ohchi et al. |
| 2012/0082016 A1 | 4/2012 | Komura |
| 2013/0128334 A1 | 5/2013 | Stephen |
| 2013/0279844 A1 | 10/2013 | Na et al. |
| 2015/0212242 A1 | 7/2015 | Chen et al. |
| 2017/0084661 A1* | 3/2017 | Seddon ................... H01L 24/05 |
| 2017/0227685 A1 | 8/2017 | Chen et al. |

FOREIGN PATENT DOCUMENTS

| | | |
|---|---|---|
| JP | 2003-315521 | 11/2003 |
| JP | 2004-532427 | 10/2004 |
| JP | 2006-012286 | 1/2006 |
| JP | 2007-058100 | 3/2007 |
| JP | 2007-187835 | 7/2007 |
| JP | 2008-513838 | 5/2008 |
| JP | 2010-181742 | 8/2010 |

OTHER PUBLICATIONS

EP Extended European Search Report issued in European Application No. 18199290.0, dated Feb. 25, 2019, 10 pages.
Japanese Office Action in Application No. JP2015-012381, dated Dec. 18, 2018 8 pages (with English Translation).
Chen et al., "Fabrication-Tolerant Waveguide Chirped Grating Coupler for Coupling to a Perfectly Vertical Optical Fiber," IEEE Photonics Technol Lett., Dec. 2008, 20(23):1914-1916.
Covey and Chen, "Efficient perfectly vertical fiber-to-chip grating coupler for silicon horizontal multiple slot waveguides," Optics Express, May 2013, 21(9):10886-10896.
Ding et al., "Ultrahigh-efficiency apodized grating coupler using fully etched photonic crystals," Optics Lett., Aug. 2013, 38(15):2732-2734.
European Search Report in Application No. 15152635.7 dated Aug. 26, 2015, 6 pages.
Extended European Search Report issued in EP14189392.5-1553 dated Mar. 2, 2015, 7 pages.
Lalanne and Hugonin, "Bloch-Wave Engineering for High-Q, Small-V Microcavities," IEEE J Quantum Electronics, Nov. 2003, 39(11):1430-1438.
Li et al., "CMOS-compatible high efficiency double-etched apodized waveguide grating coupler," Optics Express, Apr. 2013, 21(7):7868-7874.
Mekis et al., "A Grating-Coupler-Enabled CMOS Photonics Platform," IEEE J Selected Topics Quantum Electronics, May/Jun. 2011, 17(3):597-608.
Na et al., "Efficient broadband silicon-on-insulator grating coupler with low backreflection," Optics Lett., Jun. 2011, 36(11):2101-2103.
Partial European Search Report in Application No. 15152635.7, dated May 28, 2015, 8 pages.
PCT International Search Report in International Application No. PCT/US18/31870, dated Aug. 10, 2018, 14 pages.
Roelkens et al., "High efficiency grating coupler between silicon-on-insulator waveguides and perfectly vertical optical fibers," Optics Lett., Jun. 2007, 32(11):1495-1497.
Schrauwen et al., "Polymer wedge for perfectly vertical light coupling to silicon," Integrated Optics: Devices, Materials, and Technologies XIII, Jan. 2009, 8 pages.
Taillaert et al., "A Compact Two-Dimensional Grating Coupler Used as a Polarization Splitter," IEEE Photonics Technol Lett., Sep. 2003, 15(9):1249-1251.
U.S. Non-Final Office Action for U.S. Appl. No. 14/601,737 dated Jul. 19, 2016, 16 pages.
U.S. Non-Final Office Action in U.S. Appl. No. 15/496,643, dated Oct. 4, 2018, 15 pages.
U.S. Notice of Allowance for U.S. Appl. No. 14/601,737 dated Jan. 17, 2017, 8 pages.
U.S. Appl. No. 14/291,253, "Optical Device for Redirecting Incident Electromagnetic Wave," filed May 30, 2014, 39 pages.
Wang et al., "Embedded Slanted Grating for Vertical Coupling Between Fibers and Silicon-on-Insulator Planar Waveguides," IEEE Photonics Technol Lett., Sep. 2005, 17(9):1884-1886.

(56) References Cited

OTHER PUBLICATIONS

Wu et al., "A critically coupled Germanium photodetector under vertical illumination," Optics Express, Dec. 2012, 20(28):29338-29346.

* cited by examiner

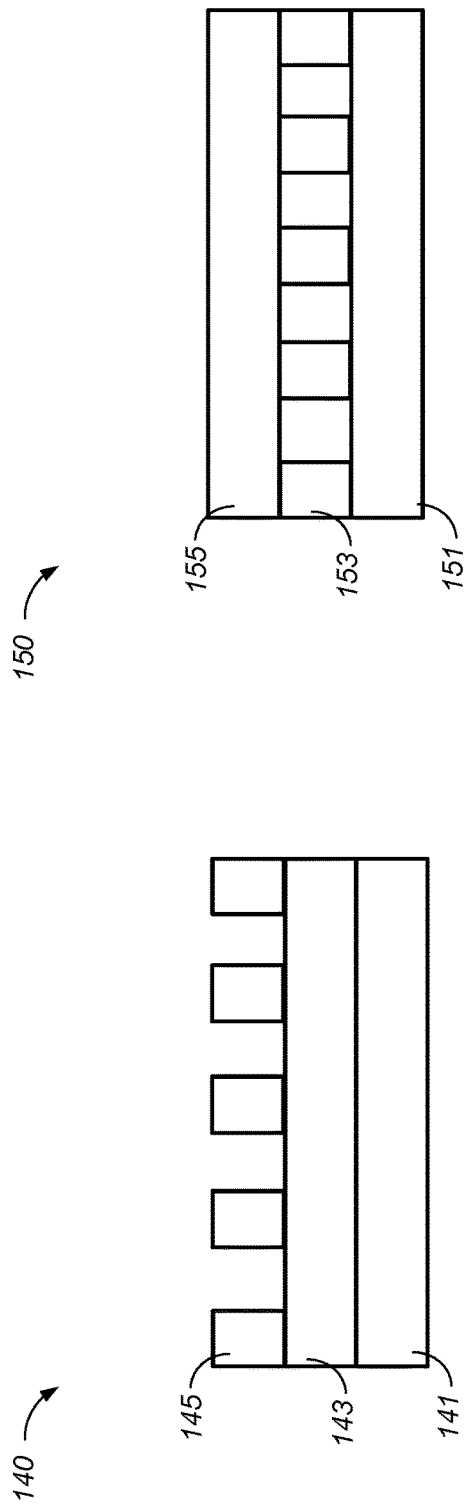
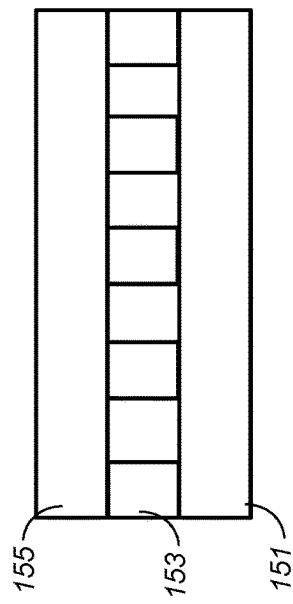
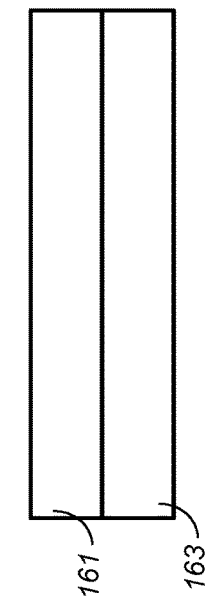
FIG. 1C
FIG. 1D
FIG. 1E

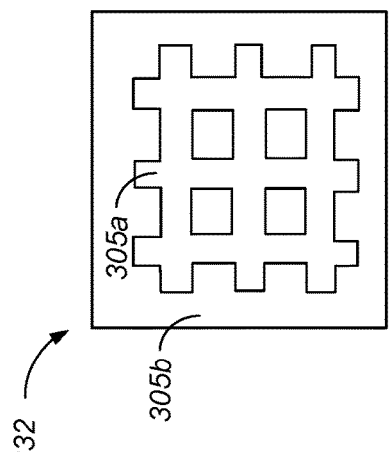
FIG. 3B
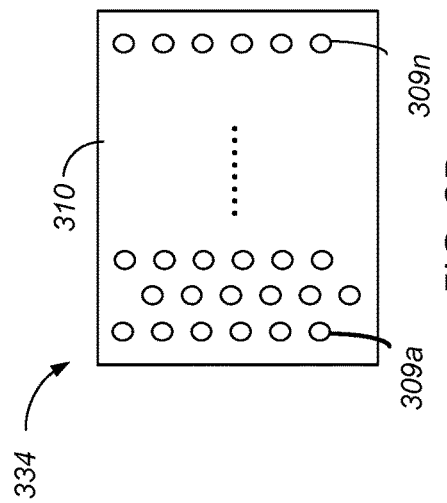
FIG. 3D
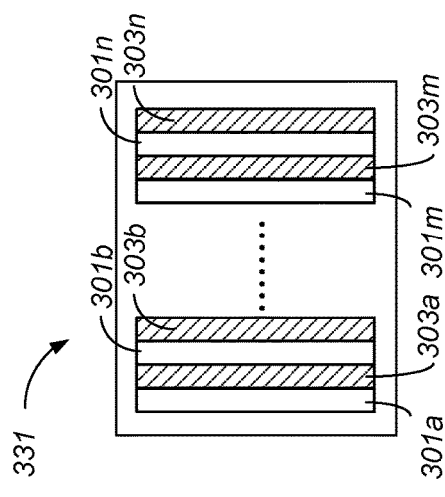
FIG. 3A
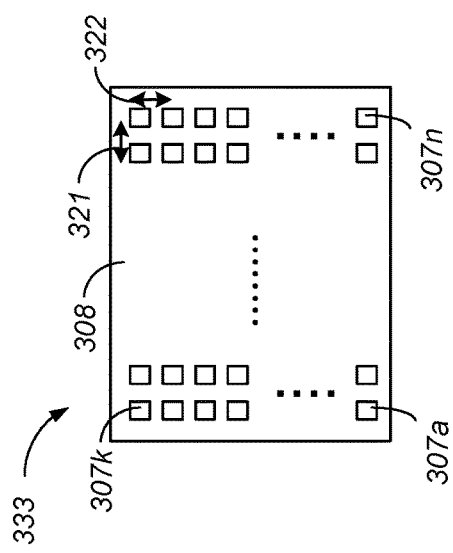
FIG. 3C
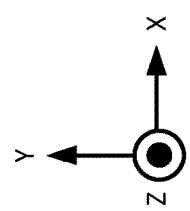

OPTICAL APPARATUS FOR NON-VISIBLE LIGHT APPLICATIONS

CROSS-REFERENCE TO RELATED APPLICATIONS

This patent application claims the benefit of U.S. Provisional Patent Application No. 62/503,922, filed on May 9, 2017, and is a continuation-in-part of U.S. Non-provisional patent application Ser. No. 15/496,643, filed on Apr. 25, 2017, which is a continuation of U.S. Non-provisional patent application Ser. No. 14/601,737, filed on Jan. 21, 2015, now U.S. Pat. No. 9,651,718, issued on May 16, 2017, which claims the benefit of U.S. Provisional Patent Application No. 62/086,727, filed on Dec. 3, 2014, U.S. Provisional Patent Application No. 62/079,498, filed on Nov. 13, 2014, U.S. Provisional Patent Application No. 62/063,426, filed on Oct. 14, 2014, U.S. Provisional Patent Application No. 61/946,799, filed on Mar. 2, 2014, and U.S. Provisional Patent Application No. 61/932,232, filed on Jan. 27, 2014, all of which are incorporated in their entirety by reference.

BACKGROUND

This specification relates to coupling light using an optical device.

Light is guided between a photonic integrated circuit and an external medium using an optical device.

SUMMARY

Implementations of the present disclosure are directed to optical devices for guiding, processing, or detecting electromagnetic radiations. More particularly, implementations are directed to fabricating optical devices for refracting and/or filtering electromagnetic radiations with wavelengths in predetermined ranges of wavelengths.

In general, one innovative aspect of the subject matter described in this disclosure can be described as an optical device fabrication method including removing semiconductor material from a semiconductor substrate to form a first curved surface and a second curved surface, forming a bonding material on the first curved surface, and selectively removing semiconductor material from at least one of the first and the second curved surfaces to form one or more subwavelength structures. The semiconductor substrate has a bandgap wavelength associated with a bandgap energy of the semiconductor material. Forming the bonding material includes depositing bonding material on the first curved surface. The second curved surface is formed opposite the first curved surface of the optical device. At least one subwavelength structure has at least one dimension smaller than the bandgap wavelength of the semiconductor substrate. The optical device is configured to refract incident electromagnetic radiation having wavelengths in a first range of wavelengths and/or to filter electromagnetic radiation having wavelengths in a second range of wavelengths, the first range of wavelengths being infrared wavelengths longer than the bandgap wavelength and the second range of wavelengths being shorter than the bandgap wavelength.

This and other implementations can optionally include one or more of the following features. The bandgap energy of the semiconductor material of the optical device can be 1.2 eV to 1.7 eV. In some implementations, the first range of wavelengths may be from 800 nm to 2,000 nm. In some implementations, the second range of wavelengths may be from 400 nm to 800 nm.

The fabrication method may further include arranging an optical element relative to the bonding layer so that the optical element receives electromagnetic radiation refracted by the optical device. The optical element can be an active element configured to tune the first range of wavelengths and/or the second range of wavelengths. Tuning can include absorbing or emitting electromagnetic radiation in a respective tuned range of wavelengths. In some implementations, the optical element is selected from the group consisting of: a photodetector, a sensor, a light emitting diode, and a laser. In some implementations, the optical element includes SiGe.

The fabrication method can also include forming one or more structures on the second curved surface of the optical device. The one or more structures may form an optical element selected from a group consisting of: a photodetector, a sensor, a photo emitting diode, and a laser.

In some implementations, the bonding layer has an optical thickness corresponding to a focal length of the optical device. The bonding layer can include a bonding material selected from the group consisting of: an oxide, a nitride, and a metal. In some implementations, forming the bonding layer further comprises planarizing the bonding layer through chemical-mechanical planarization.

The second curved surface may have the same radius of curvature as the first curved surface. In some implementations, at least one of the first curved surface and the second curved surface is formed by using a grayscale mask.

Removing the semiconductor material from the semiconductor substrate can include etching the semiconductor substrate. The one or more subwavelength structures can include a plurality of subwavelength structures arranged periodically.

In some cases, the optical device has an effective refractive index that is dynamically adjustable in response to applying an electric field. The optical device can be a lens.

In some implementations, the optical device is a first optical device and the bonding layer is a first bonding layer, and the fabrication method further includes coupling a second optical device to the first optical device. For example, a second bonding layer may be formed on the second curved surface of the first optical device by depositing bonding material on the second curved surface, and the second optical device may be coupled to the second bonding layer and opposite the first optical device. The first optical device and the second optical device can be configured to collectively refract incident electromagnetic radiation having wavelengths in a third range of wavelengths and/or to filter electromagnetic radiation having wavelengths in a fourth range of wavelengths. In some examples, the third range of wavelengths is a subrange of the first range of wavelengths. In some examples, the fourth range of wavelengths is a subrange of the second range of wavelengths.

In some implementations, the second optical device comprises at least one curved surface that includes one or more subwavelength structures. At least one subwavelength structure can have at least one dimension smaller than the bandgap wavelength of the semiconductor substrate. In some implementations, the second bonding layer has an optical thickness sufficient so that electromagnetic radiation refracted by the first optical device can be focused to the second optical device.

Implementations of the present disclosure provide one or more of the following advantages. The implementations provide techniques for mass production of semiconductor lenses. Compared to conventional glass lenses, which are transparent to visible and infrared radiations, semiconductor lenses can absorb visible and near infrared radiations. A semiconductor-based lens according to the present implementations can be used for refraction and/or absorption of electromagnetic radiations with near infrared or infrared wavelengths. In addition, a semiconductor lens described herein can be fabricated so that selective incident electromagnetic radiations can be absorbed and/or refracted. Compared to glass lenses, semiconductor lenses described in the present disclosure have a larger refractive index as well. Such larger refractive index provides the ability to guide, focus, or defocus the refracted radiations in a shorter transmission path within the optical device.

Further, forming an optical device that refracts and filters light as one optical component may decrease integration complexity with other optical components in an optical system. Forming a refractive element that refracts and filters light as one optical component may decrease the fabrication cost. The refractive element may be planarly formed on a wafer to integrate with a photonic integrated circuit. Multiple refractive elements having different filter ranges can be formed in one fabrication process by varying the periodic structures in the respective refractive element. A refractive element may be integrated with an active element to tune the refraction or the filter range of the refractive element.

The details of one or more implementations are set forth in the accompanying drawings and the description below. Other potential features and advantages will become apparent from the description, the drawings, and the claims.

BRIEF DESCRIPTION OF THE DRAWINGS

FIGS. 1B, 1C, and 1D illustrate example optical devices, according to implementations of the present disclosure.

FIG. 1E illustrates an example of cascaded optical elements, according to implementations of the present disclosure.

FIGS. 3A-3D illustrate example substructures, according to implementations of the present disclosure.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
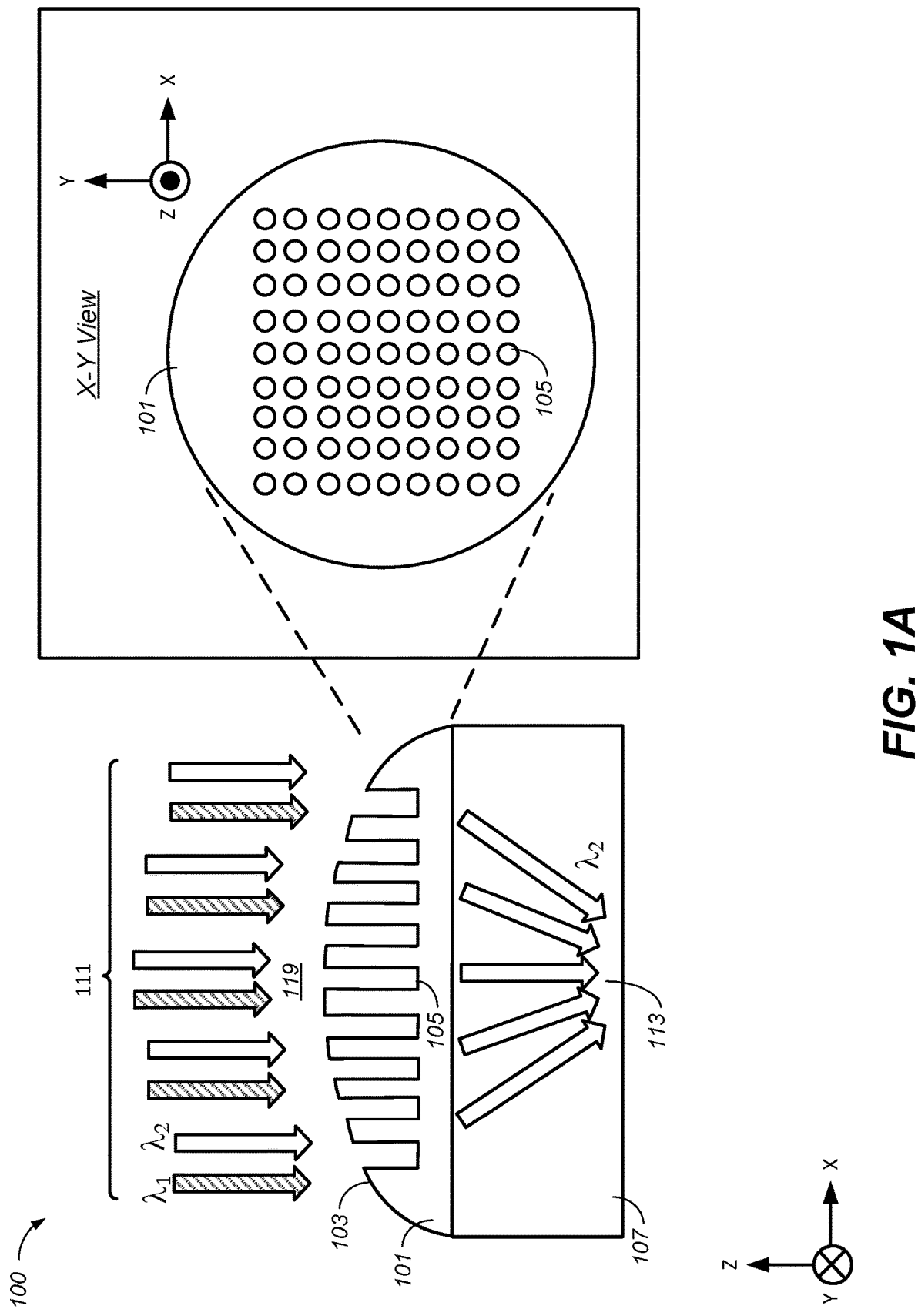
FIG. 1A illustrates a block diagram of an example optical device as part of a photonic integrated circuit, according to implementations of the present disclosure.

FIG. 1A is a block diagram of an example optical device 100 that includes a refractive element 101, according to implementations of the present disclosure. The refractive element 101 (also referred to herein as a "lens") can be used for coupling of light into and out of the optical device 100. Examples of the optical device 100 include, but are not limited to, lens, optical filter, collimator. Examples of lens includes transmissive lens, reflective lens, or a combination thereof. The optical device 100 can refract, filter, collimate, focus, defocus, diverge, converge, and/or reflect optical beams.

In general, an optical device may be associated with one or more optical specification parameters. In some implementations, an optical specification parameter may be a numerical aperture that allows the optical element to capture a cone of light within a specific angle. For example, a single-mode fiber may be associated with a numerical aperture of 0.14. In some implementations, an optical specification parameter may be a specific size that allows the optical element to transmit or receive light. For example, an optical detector may have a detector area of 100 µm² for receiving light. Light transmitted from one optical element to another optical element with a mismatch in optical specification parameters typically results in a loss in optical power. To reduce loss, a lens may be used to reduce the mismatch in the optical specification parameters between two optical elements. For example, a lens may be used to match the numerical aperture between two optical elements. As another example, a lens may be used to focus light to an optical element having a smaller area. Moreover, light propagating in an optical system may be associated with multiple wavelengths, and a filter may be used between optical elements to select one or more target wavelengths from the multi-wavelength light. It may be desirable to integrate a lens or a filter with other optical element to reduce integration complexity and fabrication cost. It may also be desirable to integrate a lens and a filter into one optical device to reduce integration complexity and fabrication cost.

The optical device 100 includes the refractive element 101 and an optical medium 107. In general, the refractive element 101 is configured to collectively refract and/or filter light either from an external medium 119 to the optical medium 107, or from the optical medium 107 to the external medium 119. As an example, an input light 111 having two wavelengths $\lambda_1$ and $\lambda_2$ enters the optical device 100, the wavelength $\lambda_1$ is filtered out by the refractive element 101, and the wavelength $\lambda_2$ is refracted and focused by the refractive element 101 as a focused light beam 113 in the optical medium 107. Note that this example is not limiting, and the refractive element 101 may be designed to select or filter one or more other wavelengths, or may be designed to perform other optical functions such as defocusing or collimating of a light beam.

The refractive element 101 is composed of one or more semiconductor materials. For example, the refractive element 101 may be made of silicon, germanium, tin, or III-V compounds. The refractive element 101 has a bandgap energy that is determined based on the bandgap energies of the semiconductor materials included in the refractive element 101. The refractive element 101 has a bandgap wavelength that can be determined based on the bandgap energy of the refractive element 101, for example, by $$\lambda = hc/E \quad (1)$$

where λ is the bandgap wavelength, h is Plank's constant, c is speed of light, and E is the bandgap energy.

Based on bandgap energy of the refractive element 101, the refractive element 101 can filter or refract electromagnetic radiations in particular wavelengths ranges. For example, a refractive element 101 with a bandgap wavelength of 700 nm can absorb (or filter) incident electromagnetic radiations with wavelengths shorter than 700 nm (e.g., visible light wavelengths), and can transmit (or refract) incident electromagnetic radiations with wavelengths longer than 700 nm (e.g., infrared wavelengths).

In general, the refractive element 101 includes one or more curved surfaces (e.g., curved surface 103) and/or one or more substructures 105. The curved surface 103 can have a predetermined radius of curvature and its surface curvature may be configured to refract the incident light beam according to Snell's law or any suitable numerical analysis models. Examples of a numerical analysis model include a ray tracing model, a Gaussian beam model, a beam propagation method (BPM) model, a Fourier beam propagation model, or a finite-difference time-domain (FDTD) model.

The one or more substructures 105 can include a group of one dimensional, two-dimensional, three-dimensional, or a combination of periodic substructures. In the example shown in FIG. 1A, a group of two-dimensional periodic substructures are formed in the refractive element 101. As used in this specification, the substructures 105 may include photonic crystals, gratings, or periodic substructures that affect an optical property of light coupled to the periodic substructures. Additional examples of substructures 105 are described in more details in FIGS. 3A to 3E.

In some implementations, a group of substructures 105 are periodic (referred to herein as "the periodic substructures") and may be configured to refract or to filter light according to a guided mode resonance effect. In a guided mode resonance effect, the group of substructures are formed with a material having a higher refractive index than the bulk of the refractive element 101, the optical medium 107, and the external medium 119 to produce at least a guided mode in the periodic substructures. The guided mode interferes with a diffraction mode of the periodic substructures to yield a resonance response that can be used as a filter. In some implementations, a combination of the curved surface 103 and the resonance response may refract light in different directions.

In some implementations, one or more substructures 105 are subwavelength structures. A subwavelength structures can have at least one dimension smaller than the bandgap wavelength of the refractive element 101. In some implementations, a group of substructures 105 are arranged in a periodic pattern. In some examples, the period of the periodic substructures according to a guided mode resonance effect is smaller than the bandgap wavelength of the refractive element 101. Additional examples of subwavelength structures are described in more detail in FIB. 1B.

In some implementations, a group of the substructures 105 may be configured to refract or to filter light according to an effective index change effect. In an effective index change effect, the group of the substructures 105 is designed to produce a varying effective index profile along an axis of the refractive element 101. For example, the group of the substructures 105 may vary in hole diameters and/or in periodicity along the x and y axes to yield a varying effective index profile. In some implementations, a combination of the curved surface 103 and the varying effective index profile may refract light in different directions. In some implementations, a combination of the curved surface 103 and the varying effective index profile may cause a joint phase shift effect of the refracted light to yield an optical focuser/defocuser. In some implementations, the group of the substructures 105 according to an effective index change effect are periodic, with a period that may be in the dimension of deep subwavelength.

In some implementations, to reduce or to eliminate the polarization effect of the input light 111, a group of the substructures 105 may be arranged to possess a 90 degree rotational symmetry around its optical axis. In this example, the optical axis is along the z-axis at the center of the refractive element 101.

The optical medium 107 may be any medium that can transmit, guide, detect, or generate light. For example, the optical medium 107 may be a semiconductor substrate such as silicon, oxide, nitride or their combinations. As another example, the optical medium 107 may be air. As another example, the optical medium 107 may be a germanium photodetector that absorbs light. As another example, the optical medium 107 may be a multi-layer vertical-cavity surface-emitting laser (VCSEL).

An external medium 119 may be any medium that can transmit, guide, detect, or generate light. For example, the external medium 119 may be an optical fiber. As another example, the external medium 119 may be a photo-detector. As another example, the external medium 119 may be a light source. As another example, the external medium 119 may be air. As another example, the external medium 119 may be a semiconductor substrate such as silicon, oxide, nitride or their combinations. In some implementations, a cladding layer composed of one or more layers of nitride, oxide, air, or an organic material, may be formed between the external medium 119 and the refractive element 101.

In some implementations, the refractive element 101 and the optical medium 107 may be composed of different materials. For example, the refractive element 101 may be composed of silicon, and the optical medium 107 may be composed of oxide. In some implementations, the refractive element 101 and the optical medium 107 may be the same material. For example, the refractive element 101 and the optical medium 107 may be composed of germanium or other III-V compounds. In some implementations, the refractive element 101 may be composed of multiple layers of materials. FIGS. 1C and 1D describe examples of a multi-layer optical device. In some implementations, the optical medium 107 may be composed of multiple layers of materials. For example, multi-layer anti-reflection coating may be deposited to minimize the reflection between the refractive element 101 and the optical medium 107. In some implementations, the optical device may function as a filter, a focuser/defocuser, or both.

Figure 1B:
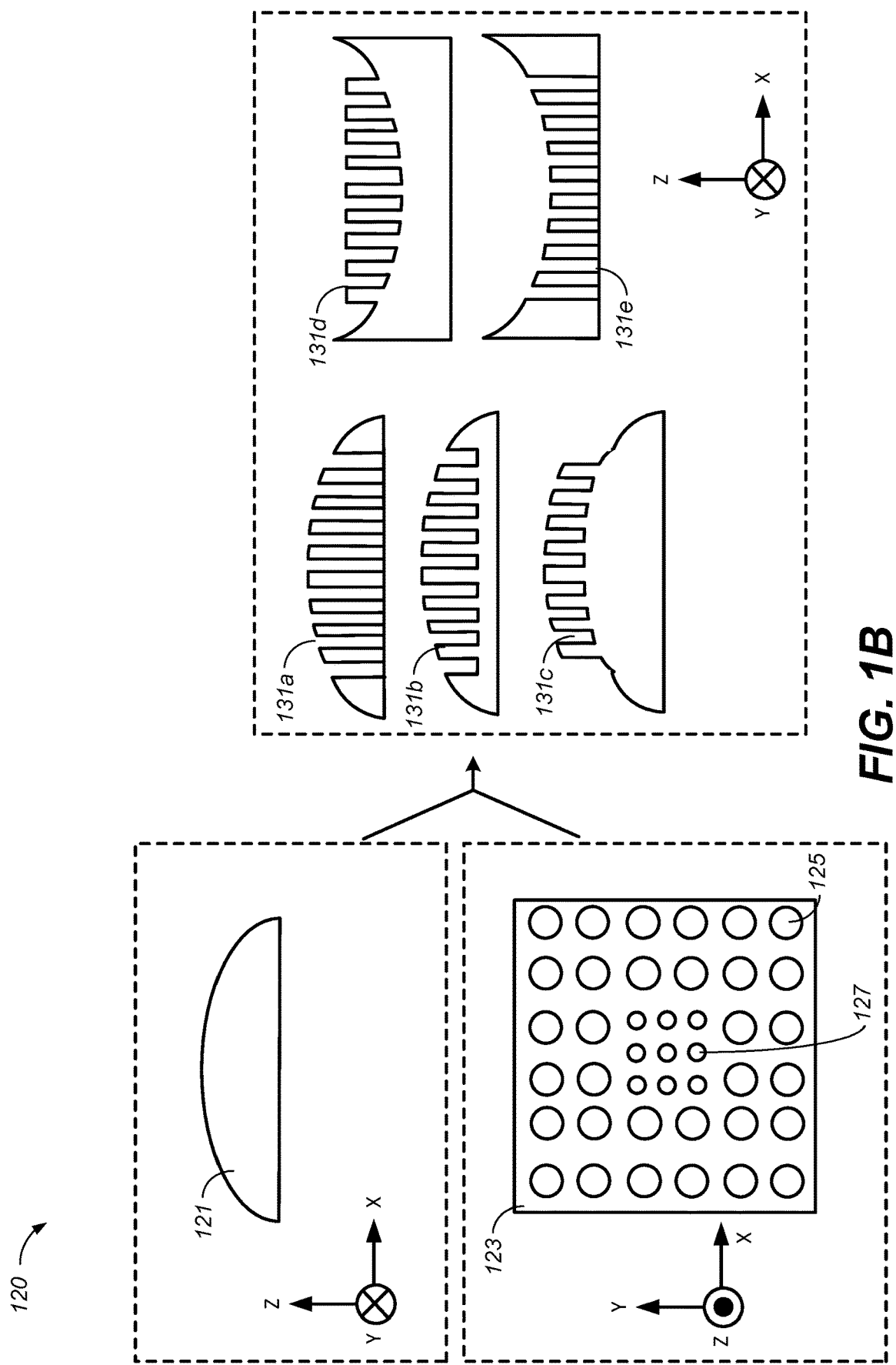

FIG. 1B shows examples of refractive elements 131a-131e that may be implemented as a refractive element 101 in the optical device 100. Any one of the refractive elements 131a-131e may also be implemented in any one of the other optical devices described throughout this application, or in another photonic integrated circuit not described in this application.

Conceptually, a refractive element may be separated into a lens portion 121 and a substructure portion 123. In general, light incident on a surface of the lens portion 121 is refracted by the surface having a predetermined radius of curvature. In some implementations, the surface curvature may be induced by an intentional or nonintentional process strain induced, where the radius of curvature is significantly larger relative to the dimension of the refractive element. In some implementations, the surface may be patterned and etched using a grayscale mask to form a surface curvature.

Generally, the substructure portion 123 includes one or more one-dimensional, two-dimensional, three-dimensional substructures. The substructures can create one or more groups of periodic substructures. For example, the substructure portion 123 shown in FIG. 1B includes a first group of periodic substructures 125 and a second group of periodic substructures 127. The first group of periodic substructures 127 may be designed to produce an effective index change effect. The second group of periodic substructures 125 may be designed to produce a guided mode resonance effect. In some implementations, a superposition of the first group of periodic substructures 125 and the second group of periodic substructures 127 yields a structure portion 123 that both refracts and filters incident light.

The lens portion 121 and the substructure portion 123 may be combined to form a refractive element. For example, a refractive element 131a may be formed by etching the substructure portion to the bottom of the lens portion to provide a higher index contrast between the substructure portion and the lens portion. As another example, if the lens portion has a convex surface, a refractive element 131b may be formed by etching the substructures such that peaks of the substructures follow the curvature of the lens portion. The refractive element 131b may be formed by etching the substructures after forming the lens portion. As another example, if the lens portion has a convex surface, a refractive element 131c may be formed by etching the substructures such that peaks of the substructures follow the curvature of the lens portion. The refractive element 131c may be formed by etching the inverse pattern of the substructures after forming the lens portion.

As another example, if the lens portion has a concave surface, a refractive element 131d may be formed by etching the substructures such that valleys of the substructures follow the curvature of the lens portion. The refractive element 131d may be formed by etching the substructures before forming the lens portion. As another example, if the lens portion has a concave surface, a refractive element 131e may be formed by etching the substructures such that peaks of the substructures follow the curvature of the lens portion. The refractive element 131e may be formed by etching the substructures after forming the lens portion.

In some implementations, to filter, focus, or defocus one or more wavelengths of an incident light, one or more substructures may be filled with a material having a different refractive index from an effective refractive index of the refractive element. For example, a refractive element may be composed of silicon, where the group of substructures are at least partially filled with oxide or nitride. In some implementations, to filter, focus, or defocus one or more wavelengths of an incident light, one or more substructures may be formed to have a different radius from a radius of one or more other substructures. For example, the periodic substructures 125 have a different radius from a radius of the periodic substructures 127. In some implementations, a group of the substructures is subwavelength structures with at least one dimension smaller than the bandgap wavelength of the lens. For example, the substructures in the periodic substructures 127 may be subwavelength structures with a diameter smaller than the bandgap wavelength of the lens 121. In some implementations, to filter, focus, or defocus one or more wavelengths of an incident light, a plurality of substructures of the group of periodic substructures may be formed with a locally non-uniform period.

FIG. 1C shows an example of a multi-layer refractive element 140 that may be implemented in the optical device 100. Note that although not shown here, the multi-layer refractive element 140 may include a curved surface. The multi-layer refractive element 140 includes three layers 141, 143, and 145. In some implementations, the layers 141, 143, and 145 may be composed of a combination of different materials, such as dielectric (e.g., oxide, nitride, polymer, or air), semiconductor (e.g., silicon, germanium, or III-V materials), or metal (e.g., aluminum, tungsten, or other metals). For example, one or more of the three layers 141, 143, and 145 may be composed of an absorption material such as germanium. As another example, two or more of the three layers 141, 143, and 145 may be composed of a gain material such as III-V materials. Substructures may be formed on the top layer 145, where the two other layers 141 and 143 may be formed to provide a surface strain on the top layer 145 to form the surface curvature of the multi-layer refractive element 140. In some other implementations, the multi-layer refractive element 140 may include fewer or more layers. In some other implementations, the periodic substructures may be formed on more than one layers.

FIG. 1D shows an example of a multi-layer refractive element 150 that may be implemented in the photonic optical device 100. Note that although not shown here, the multi-layer refractive element 150 may include a curved surface. The multi-layer refractive element 150 includes three layers 151, 153, and 155. The layers 151, 153, and 155 may be composed of a combination of different materials, such as dielectric (e.g., oxide, nitride, polymer, or air), semiconductor (e.g., silicon, germanium, or III-V materials), or metal (e.g., aluminum, tungsten, or other metals). For example, one or more of the three layers 151, 153, and 155 may be composed of an absorption material such as germanium. As another example, two or more of the three layers 151, 153, and 155 may be composed of a gain material such as III-V materials. In some implementations, one or more substructures may be formed on the layer 153 between the two other layers 151 and 155. For example, the layer 153 may be a material with a higher refractive index than the layers 151 and 155 to produce a guide mode resonance effect in the multi-layer refractive element 150. In some other implementations, the multi-layer refractive element 150 may include fewer or more layers. In some other implementations, the substructures may be formed on more than one layers.

FIG. 1E shows an example of cascaded optical devices 160. In general, the cascaded optical devices 160 enable further design flexibilities. For example, the cascaded refractive elements 160 may include a first optical device 161 and a second optical device 163 that is optically coupled to the first optical device 161. The first and/or the second optical device can be a lens, a filter, or a combination thereof. For example, the first optical device 161 may be designed to filter a wavelength range of 930 nm to 945 nm, and the second optical device 163 may be designed to filter a wavelength range of 935 nm to 950 nm. By cascading the first optical device 161 with the second optical device 163, a narrower filter of a wavelength range of 935 nm to 945 nm may be obtained. Each of the first optical device 161 and the second optical device 163 may be implemented using any of the refractive elements described in this application. In some implementations, the first optical device 161 can be operated under an effective index change effect to change the optical beam profile and the second optical device 163 can be operated under a guided mode resonance effect to select desired wavelengths. In some implementations, an effective refractive index of the second optical device 163 is different from an effective refractive index of the first optical device 161. In some other implementations, an effective refractive index of the second optical device 163 is equal to an effective refractive index of the first optical device 161. In some implementations, the second optical device 163 includes a second group of substructures that are different from the first group of substructures of the first optical device 161. In some other implementations, the second optical device 163 includes a second group of substructures that are equal in dimensions as the first group of substructures of the first optical device 161. In some implementations, one refractive element may be a filter while the other refractive element may be a focuser or defocuser.

Figure 2A:
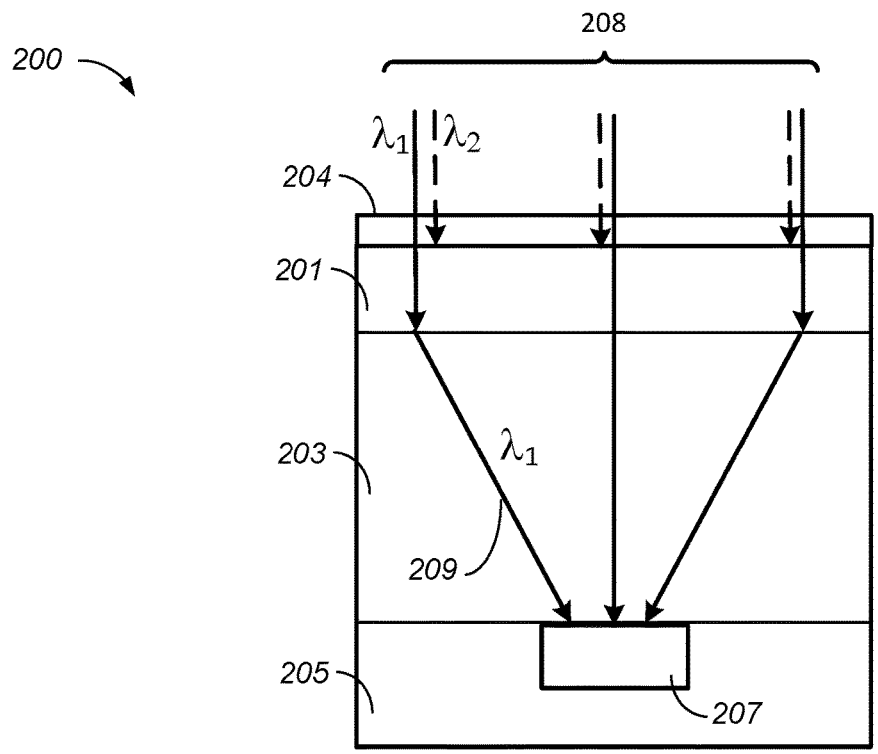
FIGS. 2A and 2B illustrate block diagrams of examples of an optical device for filtering and focusing light, according to implementations of the present disclosure.

FIG. 2A shows a block diagram of an example of an optical device 200 that integrates a refractive element with an active element. In this example, input light 208 having two wavelengths $\lambda_1$ and $\lambda_2$ are incident on the optical device 200, where one wavelength $\lambda_1$ is transmitted as light 209 and the other wavelength $\lambda_2$ is filtered out. The light 209 is focused to a photodetector for an optical power measurement of the wavelength $\lambda_1$.

The optical device 200 includes a refractive element 201, an optical medium 203, a cladding element 204, a substrate 205, and an active element 207. The refractive element 201 may be implemented using any of the refractive elements described in this application. For example, the refractive element 201 may be implemented using the refractive element 101 as described in FIG. 1A. Here, the refractive element 201 is configured to focus the input light 208 to the active element 207. In addition, the refractive element 201 is configured to reject one or more wavelengths including $\lambda_2$.

The optical medium 203 may be composed of a material that is transmissive or partially transmissive to the light 209. In some implementations, the thickness of the optical medium 203 may be the focal length of the refractive element 101. In some implementations, the thickness of the optical medium 203 may be a length that yields a specific spot size on the active element 207.

The cladding element 204 is formed over the refractive element 201 to reduce reflection of the input light 208 and/or to provide protection to the refractive element 201. In some implementations, an effective refractive index of the cladding element 204 is lower than an effective refractive index of the refractive element 201. In some implementations, the cladding element 204 may be composed of one or more layers of nitride, oxide, air, or an organic material.

The substrate 205 may be any type of substrate that is suitable for fabricating a photonic integrated circuit. For example, the substrate 205 may be a silicon wafer, a silicon-on-insulator (SOI) wafer, a III-V material such as a gallium arsenide (GaAs) or an indium phosphide (InP) wafer, a flexible organic substrate, a quartz wafer, or a glass wafer. As another example, the substrate 205 may be a layer of passive or active material deposited over an integrated electronic circuit.

The active element 207 may be an optical component that transmits, modulates, switches, or absorbs light. In this example, the active element 207 is a photodetector configured to absorb at least a portion of the light 209 to measure the optical power of the wavelength In some implementations, the active element 207 may be composed of one or more layers of silicon, germanium, tin, or II-V compounds.

Figure 2B:
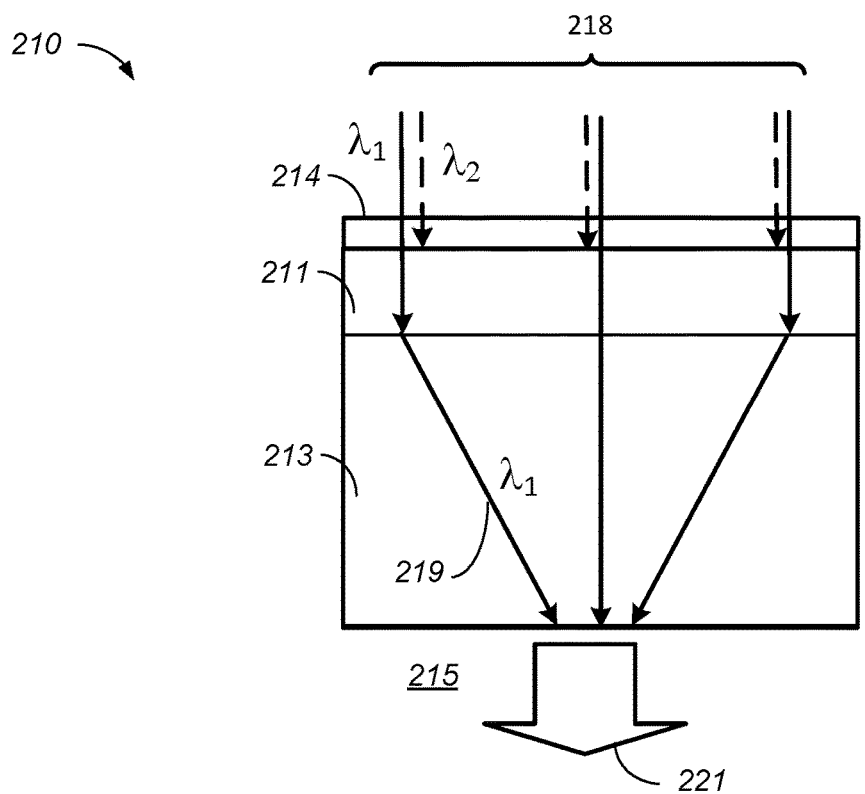

FIG. 2B shows a block diagram of an example of a optical device 210 for guiding light. In this example, input light 218 having two wavelengths $\lambda_1$ and $\lambda_2$ are incident on the optical device 210, where one wavelength $\lambda_1$ is transmitted as light 219 and the other wavelength $\lambda_2$ is filtered out. The light 219 is focused in an optical medium and then is transmitted out of the optical device 210 as light 221. The light 221 may be guided to another optical device or another optical system for further processing.

The optical device 210 includes a refractive element 211, an optical medium 213, a cladding element 214, and an external medium element 215. The refractive element 211 may be implemented using any of the refractive elements described in this application. For example, the refractive element 211 may be implemented using the refractive element 150 as described in FIG. 1D. Here, the refractive element 211 is configured to focus the input light 218. In addition, the refractive element 211 can also be configured to reject one or more wavelengths including $\lambda_2$.

The optical medium 213 may be implemented using any of the optical medium described in this application. For example, the optical medium 213 may be implemented using the optical medium 203 as described in FIG. 2A. The cladding element 214 may be implemented using any of the cladding elements described in this application. For example, the cladding element 214 may be implemented using the cladding element 204 as described in FIG. 2A. The external medium 215 may be implemented using any of the external medium described in this application. For example, the external medium 215 may be implemented using the external medium 119 as described in FIG. 1A. In some implementations, an effective refractive index of 214 is higher than an effective refractive index of the refractive element 211.

FIG. 3A shows an example of a view of a group of periodic structures 331 on a plane along the x-y dimensions. The group of periodic structures 331 is an example of the substructures that can be formed on a substructure portion of a refractive element. The descriptions of FIG. 3A may be applied to any one of the refractive elements described in this application. The group of periodic structures 331 includes an array of one-dimensional periodic structures 301a-n and 303a-n along the x direction, where n is any integer greater than one. An example of the group of periodic structures may be a one-dimensional grating or a one-dimensional photonic crystals. In some implementations, the group of periodic structures 301a-n and 303a-n may be composed of different materials. For example, the periodic structures 301a-n may be composed of silicon, and the periodic structures 303a-n may be composed of oxide. As another example, the periodic structures 303a-n may include a layer of semi-transparent metal such as ITO, that forms surface plasmonic effect. The arrangement of 301a, 303a, 301b, 303b, ..., 301n, and 303n forms the group of periodic structures of a refractive element.

FIG. 3B shows an example of a view of a group of periodic structures 332 on a plane along the x-y dimensions. The group of periodic structures 332 is an example of the substructures that can be formed on a substructure portion of a refractive element. The descriptions of FIG. 3B may be applied to any one of the refractive elements described in this application. The group of periodic structures 332 includes a two-dimensional periodic structure 305a and the layer 305b. In some implementations, the periodic structures 305a may be grating peaks of a grating. In some other implementations, the periodic structures 305a may be grating valleys of a grating. The arrangement of 305a forms the group of periodic structures of a refractive element. In some implementations, the layer 305b can be oxide and periodic structures 305a can be silicon.

FIG. 3C shows an example of a view of a group of periodic structures 333 on a plane along the x-y dimensions. The group of periodic structures 333 is an example of the substructures that can be formed on a substructure portion of a refractive element. The descriptions of FIG. 3C may be applied to any one of the refractive elements described in this application. The group of periodic structures 333 includes an array of two-dimensional rectangular periodic structure 307a to 307n along the x direction, and 307a to 307k along the y direction. In some implementations, the periodic structure 307a may be a peak of a grating or a photonic crystal. In some other implementations, the periodic structure 307a may be a valley of a grating or a photonic crystal. In some implementations, the periodic structure 307a may be composed of the same material as the layer 308, such as silicon. In some implementations, the periodic structure 307a may be composed of a different material from the layer 308. For example, the periodic structure 307a may be composed of silicon, and the layer 308 may be composed of oxide or nitride. In some implementations, the periodic structure 307a may be a square, a circle, a non-square, or combinations of different structures. The arrangement of the periodic structures 307a-n and 307a-k on the x-y plane forms the periodic structure in a refractive element. In some implementations, the period of the periodic structures along the x direction 321 and period of the periodic structures along the y direction 322 substantially match an interference pattern in the layer 308 along the x and y directions under a guided mode resonance effect.

FIG. 3D shows an example of a view of a group of periodic structures 334 on a plane along the x-y dimensions. The group of periodic structures 334 is an example of the substructures that can be formed on a substructure portion of a refractive element. The descriptions of FIG. 3D may be applied to any one of the refractive elements described in this application. The group of periodic structures 334 includes an array of two-dimensional arbitrary-shaped periodic structures 309a to 309n, where n is any integer greater than one. In some implementations, the arbitrary-shaped periodic structure 309a may be a peak of a grating or a photonic crystal. In some other implementations, the arbitrary-shaped periodic structure 309a may be a valley of a grating or a photonic crystal. In some implementations, the arbitrary-shaped periodic structure 309a may be composed of a different material from the layer 310. For example, the arbitrary-shaped periodic structure 309a may be composed of silicon-dioxide, and the layer 310 may be composed of silicon. In some implementations, the arbitrary-shaped periodic structure 309a may be a triangle, a circle, an ellipse, or combinations of different shapes. The arrangement of the arbitrary-shaped periodic structure 309a-n on the x-y plane forms the group of periodic structures of a refractive element. In some implementations, the shape, relative distance of any one of the arbitrary-shaped periodic structures 309a to 309n may be determined using numerical analysis. For example, a Finite-difference time-domain (FDTD) analysis program may be used to design the shape of each of the arbitrary-shaped periodic structure 309a to 309n.

Figure 4:
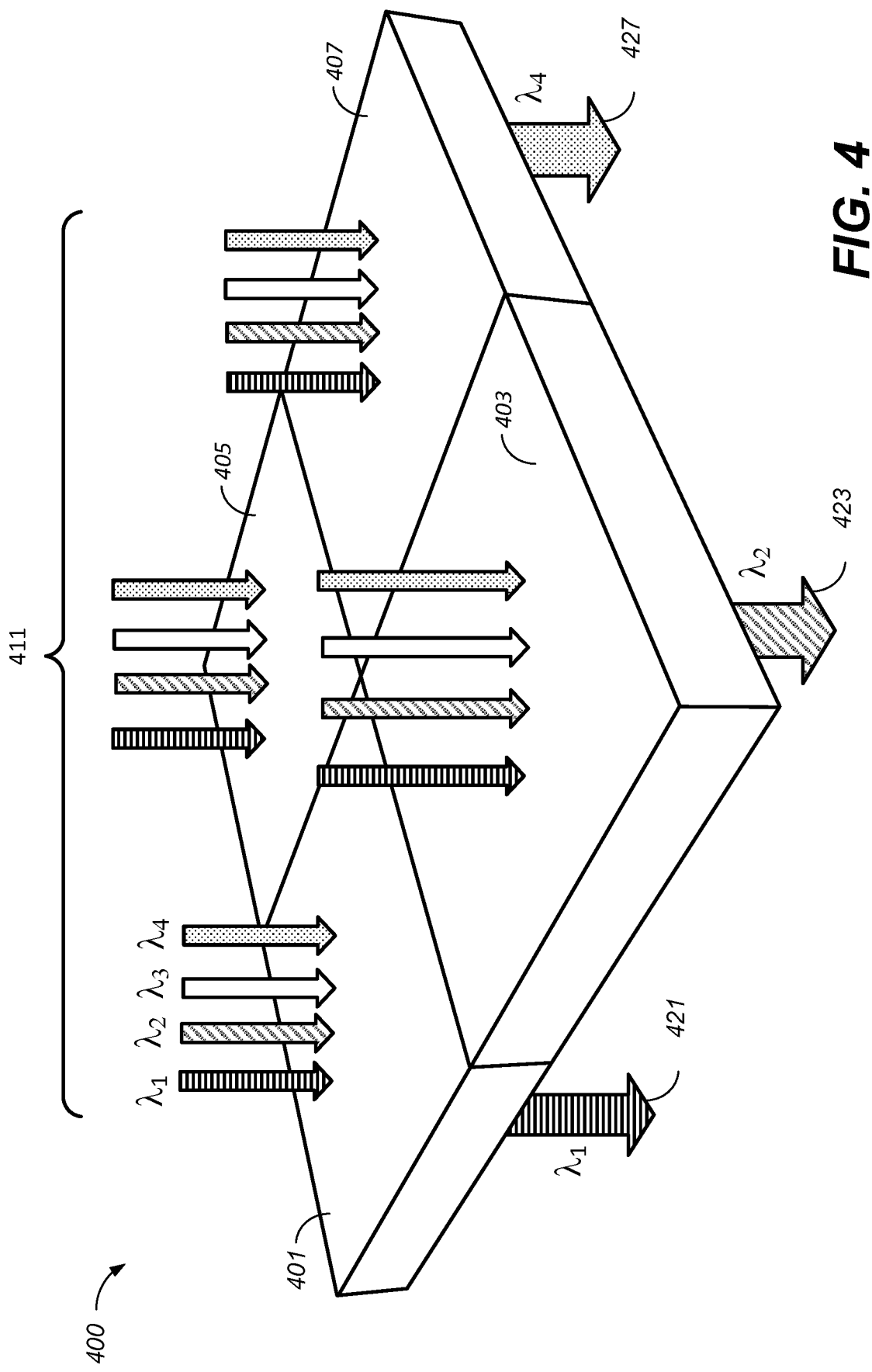
FIG. 4 illustrate an example of a photonic integrated circuit having multiple optical devices for filtering different wavelengths of light, according to implementations of the present disclosure.

FIG. 4 shows an example photonic integrated circuit 400 having multiple refractive elements for filtering different wavelengths of light. Briefly, multiple refractive elements may be formed over a single substrate, where each refractive element may be configured to filter a respective range of wavelengths, which is useful for separately monitoring optical powers of multiple wavelengths in wavelength-division multiplexing (WDM) or image/spectrum sensing applications. Additionally or alternatively, each refractive element may be formed to refract the respective range of wavelengths in a desired manner.

In this example, the photonic integrated circuit 400 includes a first refractive element 401, a second refractive element 403, a third refractive element 405, and a fourth refractive element 407, and can be fabricated by using semiconductor manufacturing methods such as lithography and etching. The first refractive element 401 is configured to refract and to pass a wavelength range that includes $\lambda_1$ but not $\lambda_2$, $\lambda_3$, or $\lambda_4$. The second refractive element 403 is configured to refract and to pass a wavelength range that includes $\lambda_2$ but not $\lambda_1$, $\lambda_3$, or $\lambda_4$. The third refractive element 405 is configured to refract and to pass a wavelength range that includes $\lambda_3$ but not $\lambda_1$, $\lambda_2$, or $\lambda_4$. The fourth refractive element 407 is configured to refract and to pass a wavelength range that includes $\lambda_4$ but not $\lambda_1$, $\lambda_2$, or $\lambda_3$. A wide spectrum light 411 that includes wavelengths $\lambda_1$, $\lambda_2$, $\lambda_3$, and $\lambda_4$ is incident on the photonic integrated circuit 400, and each of the first refractive element 401, the second refractive element 403, the third refractive element 405, and the fourth refractive element 407 filters out the respective wavelength for further processing. Note that in a different implementation, a different number of refractive elements may be formed in a photonic integrated circuit, where each of the refractive elements may not be configured to refract and/or filter a wavelength range as described in this example. In some implementations, the incident light 411 is a wide-spectrum signal wherein $\lambda_1$ covering red light spectrum, $\lambda_2$ covering green light spectrum, $\lambda_3$ covering blue light spectrum and $\lambda_4$ covering infrared spectrum. In some implementations, the photonic integrated circuit 400 can be viewed as an integrated spectrum filter, which is monolithically integrated with CMOS image sensors to reduce integration complexity and fabrication cost. Multiple refractive elements with different photonic crystal structures can be designed, fine-tuned for each targeted spectrum range, and then fabricated using the same lithography step. This allows finer spectrum filtering and more filters can be integrated with the sensors, and it means finer spectrum resolution for capturing more realistic image.

Figure 5A:
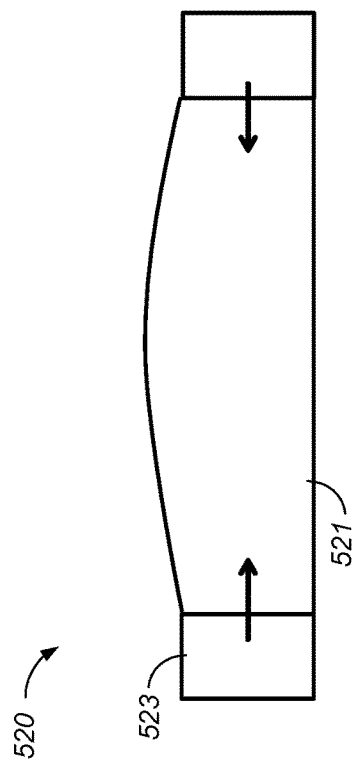
FIGS. 5A-5D illustrate examples of a refractive element having a stress-induced curvature, according to implementations of the present disclosure.

FIG. 5A shows an example a refractive element 500 having a compressive stress-induced curvature from a lattice or thermal expansion mismatch. The refractive element 500 includes a refractive element 501 and an optical medium 503. In general, when the optical medium 503 has a smaller lattice size than the refractive element 501, a compressive strain may be induced on the surface of the refractive element 501, and a convex curved surface may be formed. For example, the optical medium 503 may be composed of oxide, and the refractive element 501 may be composed of silicon. In some implementation, the convex curved surface may be used to partially focus the incident light.

Figure 5C:
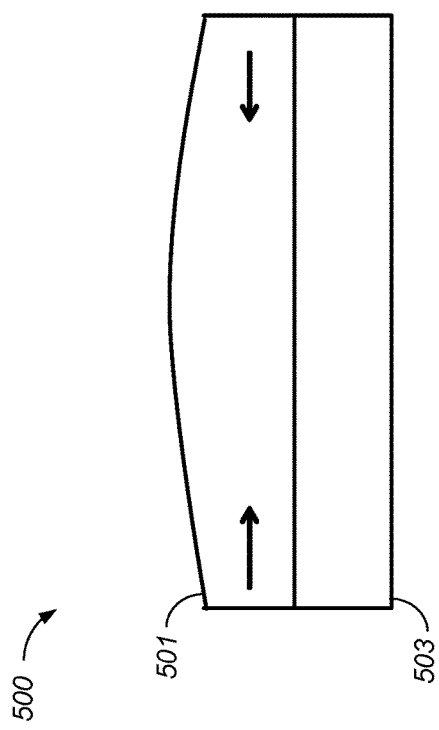
Figure 5B:
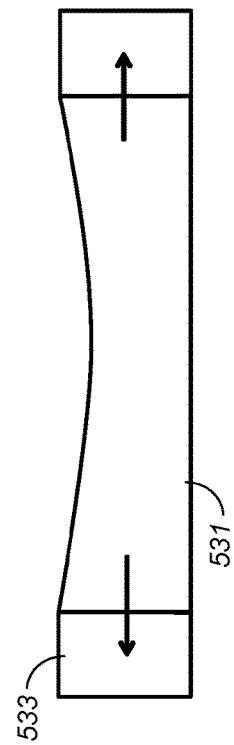

FIG. 5B shows an example a refractive element 510 having a tensile stress-induced curvature from a lattice or thermal expansion mismatch. The refractive element 510 includes a refractive element 511 and an optical medium 513. In general, when the optical medium 513 has a larger lattice size than the refractive element 511, a tensile strain may be induced on the surface of the refractive element 511, and a concave curved surface may be formed. For example, the optical medium 513 may be composed of germanium, and the refractive element 511 may be composed of silicon. In some implementation, the concave curved surface may be used to partially defocus the incident light.

FIG. 5C shows an example a refractive element 520 having a compressive stress-induced curvature from sidewalls. The refractive element 520 includes a refractive element 521 and a sidewall 523 surrounding at least a part of the circumference of the refractive element 521. When a compressive strain may be induced on the surface of the refractive element 521, and a convex curved surface may be formed. For example, the sidewall 523 may be composed of thermal oxide or dense nitride, and the refractive element 521 may be composed of silicon. In some implementation, the convex curved surface may be used to partially focus the incident light.

Figure 5D:
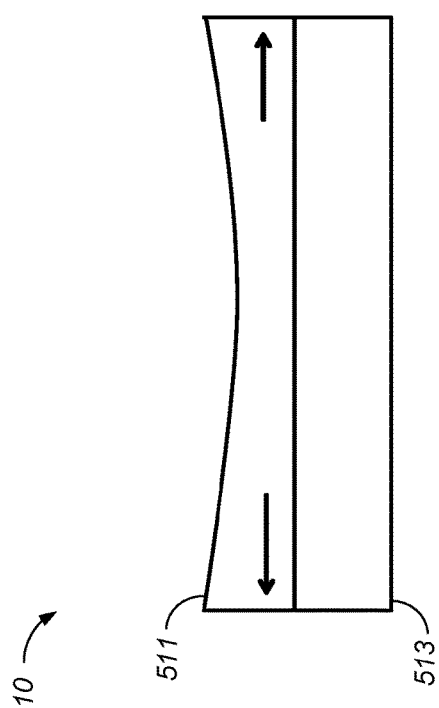

FIG. 5D shows an example a refractive element 530 having a tensile stress-induced curvature from sidewalls. The refractive element 530 includes a refractive element 531 and a sidewall 533 surrounding at least a part of the circumference of the refractive element 531. When a tensile strain may be induced on the surface of the refractive element 531, and a concave curved surface may be formed. For example, the sidewall 533 may be composed of porous oxide or nitride, and the refractive element 531 may be composed of silicon. In some implementation, the concave curved surface may be used to partially defocus the incident light.

Figure 6A:
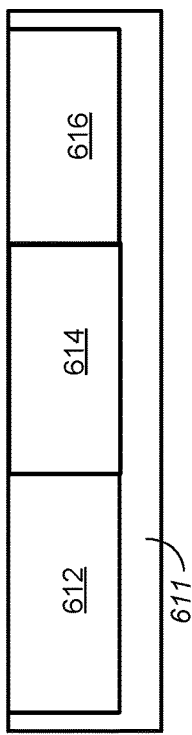
FIGS. 6A-6D illustrate examples of refractive element integrated with doped regions, according to implementations of the present disclosure.

FIG. 6A shows an example of a photonic integrated circuit 600 showing a modulation element having two doped regions and coupled to a refractive element by being at least partially embedded in the refractive element or integrated with the refractive element. Briefly, an effective refractive index of a refractive element may be modulated by a depletion or injection of free carriers from doped regions of the refractive element. The modulation of the effective refractive index of the refractive element changes the filter response and/or the refractive property of the refractive element. In some implementations, the modulation element is configured to change a direction of at least a portion of an incident light exiting the refractive element, a depth of focus of an incident light exiting the refractive element, or a selection of one or more wavelengths filtered by the group of periodic structures of the refractive element. The photonic integrated circuit 600 includes a refractive element 601. The refractive element 601 may include a group of periodic structures implemented using any of the refractive elements described in this application. In some implementations, the refractive element 601 may include a curved surface. In addition, the refractive element 601 includes a first doped region 602 and a second doped region 604. For example, the first doped region 602 may be a p-doped region, and the second doped region 604 may be an n-doped region, forming a p-n junction in the refractive element 601. In some implementations, with an application of a reverse bias voltage to the p-n junction, carriers are depleted from the junction region and the effective refractive index of the refractive element 601 is changed accordingly. In some implementations, with an application of a forward bias voltage to the p-n junction, carriers are injected into the junction region and the effective refractive index of the refractive element 601 is changed accordingly.

Figure 6B:
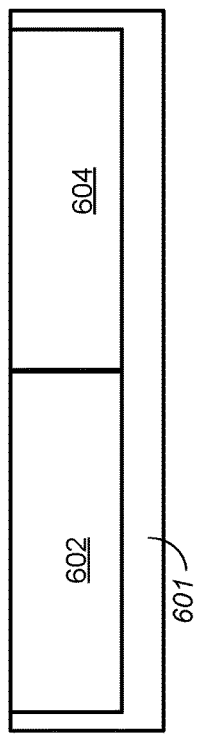

FIG. 6B shows an example of a photonic integrated circuit 610 showing a refractive element integrated with a modulation element having three doped regions. Briefly, an increase in a number of doped regions increases the number of depletion regions in a refractive element, and therefore increases the volume that the refractive index change occurs. The photonic integrated circuit 610 includes a refractive element 611. The refractive element 611 may include a group of periodic structures implemented using any of the refractive elements described in this application. In some implementations, the refractive element 611 may include a curved surface. In addition, the refractive element 611 includes a first doped region 612, a second doped region 614, and a third doped region 616. As an example, the first doped region 612 may be a p-doped region, the second doped region 614 may be an n-doped region, and the third doped region 614 may be a p-doped region, forming a p-n-p junction in the refractive element 611. As another example, the first doped region 612 may be an n-doped region, the second doped region 614 may be a p-doped region, and the third doped region 614 may be an n-doped region, forming a n-p-n junction in the refractive element 611. As an example, the first doped region 612 may be a p-doped region, the second doped region 614 may be an intrinsic region, and the third doped region 614 may be an n-doped region, forming a p-i-n junction in the refractive element 611. In some implementations, with an application of forward or reverse bias voltages, carriers are injected and/or depleted in the junction regions in the refractive element 611, and the effective refractive index of the refractive element 611 is changed accordingly.

Figure 6C:
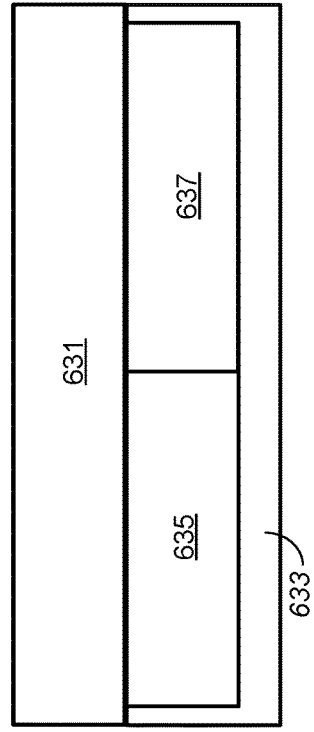

FIG. 6C shows an example of a photonic integrated circuit 620 showing a refractive element integrated with a modulation element having interdigitated doped regions. Briefly, interdigitated doped regions may be desirable when a diameter of the refractive element is much larger than one depletion region created by a p-n junction. By forming interdigitated doped regions throughout the refractive element, a larger overall change in the effective refractive index may be obtained. The photonic integrated circuit 620 includes a refractive element 621. The refractive element 621 may include a group of periodic structures implemented using any of the refractive elements described in this application. In some implementations, the refractive element 621 may include a curved surface. In addition, the refractive element 621 includes interdigitated doped regions 622a to 622n, where n is an integer. As an example, the interdigitated doped regions 622a to 622n may have alternating p and n doping, forming a p-n-p-n-p- . . . junction in the refractive element 621. As another example, the interdigitated doped regions 622a to 622n may have alternating p, intrinsic, and n doping, forming a p-i-n-p-i-n-p- . . . junction in the refractive element 621. In some implementations, with an application of reverse bias voltages, carriers are depleted from multiple depletion regions in the refractive element 621, and the effective refractive index of the refractive element 621 is changed accordingly. In some implementations, with an application of forward bias voltages, carriers are injected into multiple depletion regions in the refractive element 621, and the effective refractive index of the refractive element 621 is changed accordingly.

Figure 6D:
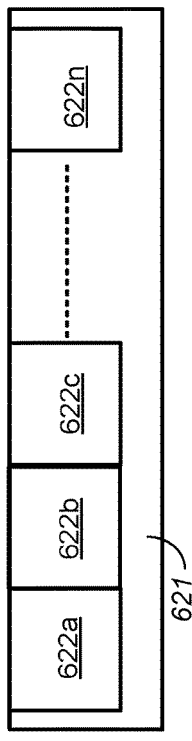

FIG. 6D shows an example of a photonic integrated circuit 630 showing an optical medium integrated with a modulation element having multiple doped regions. Briefly, an effective refractive index of an optical medium may be modulated by a depletion of injection of free carriers. The modulation of the effective refractive index of the optical medium changes the refractive property of the light exiting the refractive element. The photonic integrated circuit 630 includes a refractive element 631 formed on an optical medium 633. The refractive element 631 may include a group of periodic structures implemented using any of the refractive elements described in this application. In some implementations, the refractive element 601 may include a curved surface. The optical medium 633 includes a first doped region 635 and a second doped region 637. For example, the first doped region 635 may be a p-doped region, and the second doped region 637 may be an n-doped region, forming a p-n junction in the optical medium 633. In some implementations, with an application of a reverse bias voltage to the p-n junction, carriers are depleted from the junction region and the effective refractive index of the optical medium 633 is changed accordingly. In some implementations, with an application of a forward bias voltage to the p-n junction, carriers are injected into the junction region and the effective refractive index of the optical medium 633 is changed accordingly.

Figure 7A:
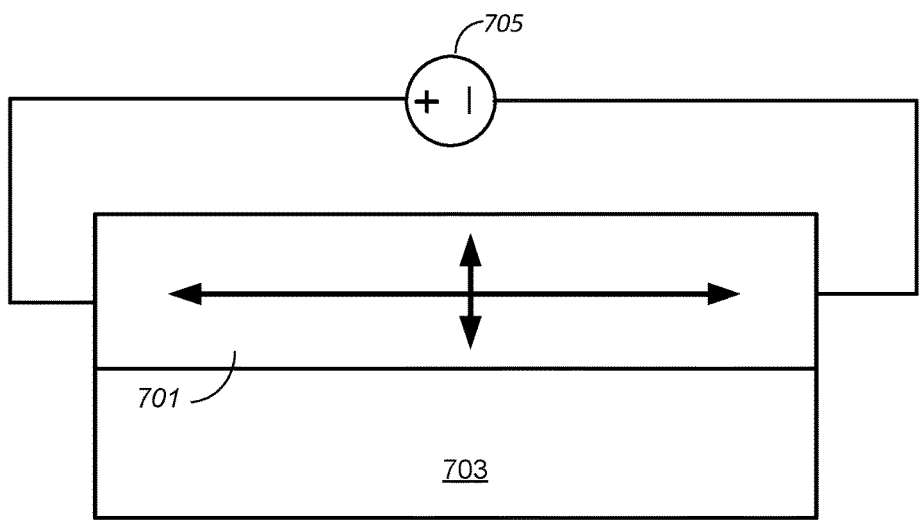
FIGS. 7A-7B show examples of a refractive element controlled by a piezoelectric effect, according to implementations of the present disclosure.

FIG. 7A shows an example of a photonic integrated circuit 700 showing a refractive element controlled by a piezoelectric effect. In general, in a piezoelectric material, an application of a voltage exerts a mechanical force to change a shape of the piezoelectric material. In this example, the photonic integrated circuit 700 includes an optical medium 703, a refractive element 701 formed on the optical medium 703, and a voltage source 705 coupled to the refractive element 701. The refractive element 701 may include a group of periodic structures implemented using any of the refractive elements described in this application. In some implementations, the refractive element 701 may include a curved surface. In addition, the refractive element 701 may include a piezoelectric material. In some implementations, an application of voltage using the voltage source 705 may exert a mechanical force in the refractive element 701 to change the predetermined radius of curvature of the surface of the refractive element 701. In some implementations, an application of voltage using the voltage source 705 may exert a mechanical force in the refractive element 701 to change the radius or period of the photonic crystal structures of the refractive element 701.

Figure 7B:
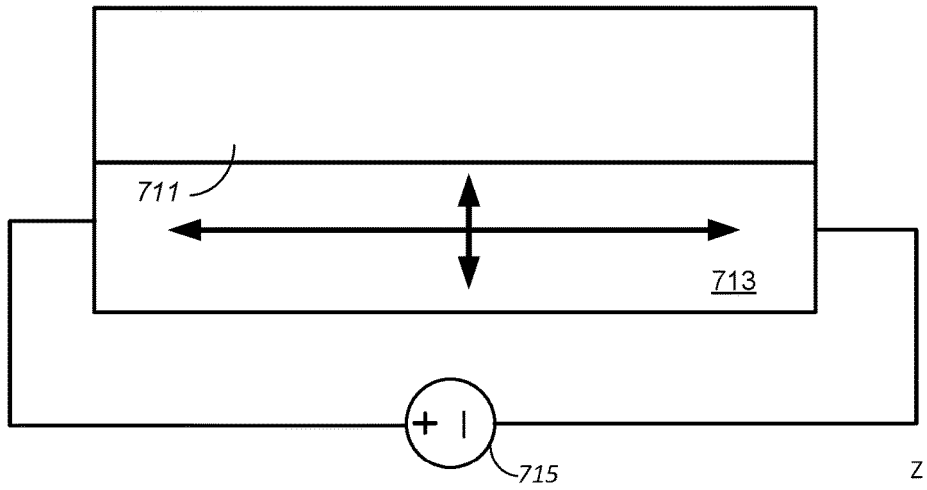

FIG. 7B shows an example of a photonic integrated circuit 710 showing a refractive element controlled by a piezoelectric effect. In this example, the photonic integrated circuit 710 includes an optical medium 713, a refractive element 711 formed on the optical medium 713, and a voltage source 715 coupled to the optical medium 713. The refractive element 711 may include a group of periodic structures implemented using any of the refractive elements described in this application. In some implementations, the refractive element 711 may include a curved surface. The optical medium 713 may include a piezoelectric material. In some implementations, an application of voltage using the voltage source 715 may exert a mechanical force in the optical medium 713, which induces a change in the predetermined radius of curvature of the surface of the refractive element 711 formed on top of the optical medium 713. In some implementations, an application of voltage using the voltage source 715 may exert a mechanical force in the optical medium 713, which induces a change of the optical path length when the light is traveling substantially along the z-axis inside the optical medium 713.

Figure 8A:
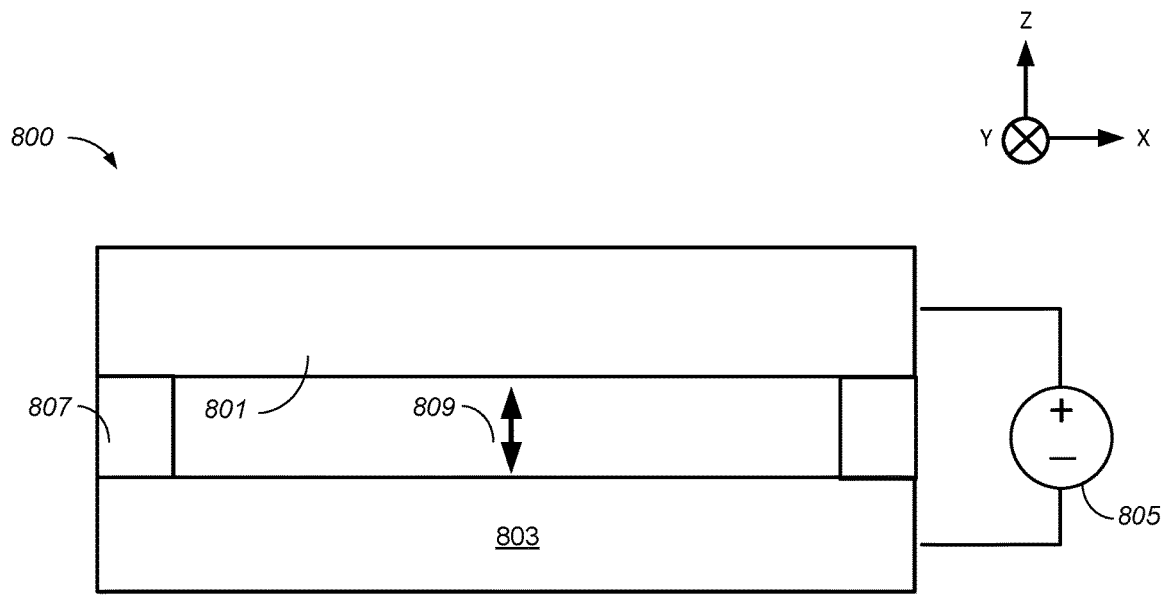
FIGS. 8A-8B show examples of a refractive element controlled by a capacitive effect, according to implementations of the present disclosure.

FIG. 8A shows an example of a photonic integrated circuit 800 showing a refractive element controlled by a capacitive effect. In general, using a Micro-Electro-Mechanical System (MEMS), an application of an electric field between a refractive element and an optical medium may generate electrostatic force which causes a change in a position of the refractive element relative to the optical medium. In this example, the photonic integrated circuit 800 includes an optical medium 803, a refractive element 801, a supporting element 807, and a voltage source 805 coupled to the refractive element 801 and the optical medium 803. The refractive element 801 may include a curved surface or a group of periodic structures implemented using any of the refractive elements described in this application. In addition, the refractive element 801 and the optical medium 803 may act as two electrodes of a capacitor and generate an electrostatic force between the refractive element 801 and the optical medium 803 with an application of an external electric field by the voltage source 805. As an example, positive charges may accumulate at the bottom of the refractive element 801 and negative charges may accumulate at the top of the optical medium 803, forming an electrostatic force acting to change the distance between the refractive element 801 and the optical medium 803. Since the supporting element 807 supports at least the two ends of the refractive element 801, the electrostatic force causes a change in a position of the refractive element relative to the optical medium, as indicated by an arrow 809. In some implementations, the change in the position may be used to adjust the optical path of the focused beam exiting the refractive element 801. In some implementations, an application of voltage using the voltage source 805 may change the radius/period of the photonic crystal structures or a predetermined radius of curvature of the refractive element 801.

Figure 8B:
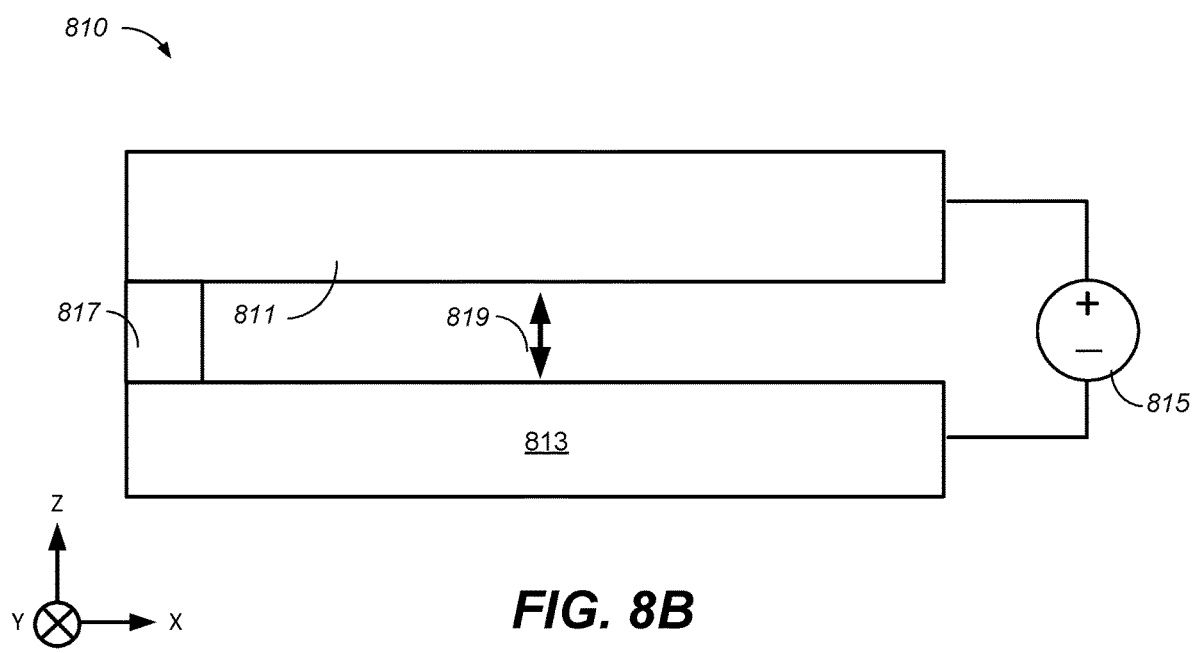

FIG. 8B shows an example of a photonic integrated circuit 810 showing a refractive element controlled by a capacitive effect. In general, using a Micro-Electro-Mechanical System (MEMS), an application of an electric field between a refractive element and an optical medium may generate electrostatic force which causes a change in an orientation of the refractive element relative to an optical axis of the incident light. In this example, the photonic integrated circuit 810 includes an optical medium 813, a refractive element 811, a supporting element 817, and a voltage source 815 coupled to the refractive element 811 and the optical medium 813. The refractive element 811 may include a curved surface or a group of periodic structures implemented using any of the refractive elements described in this application. As an example, positive charges may accumulate at the bottom of the tip of the refractive element 811 and negative charges may accumulate at the top of the optical medium 813 close to the tip of 811, forming an electrostatic force acting to change the distance between the refractive element 811 and the optical medium 813. Since the supporting element 817 supports only one end of the refractive element 811, the refractive element 811 may act as a cantilever. The electrostatic force causes a change in an orientation of the refractive element relative to an optical axis of the incident light, as indicated by an arrow 819. In some implementations, the change in the orientation may be used to adjust the incidence angle of the incident beam entering the refractive element 811. In some implementations, the change in the orientation may be used to adjust the emitting angle of the optical signal entering the refractive element 811 from the optical medium 813.

Figure 9:
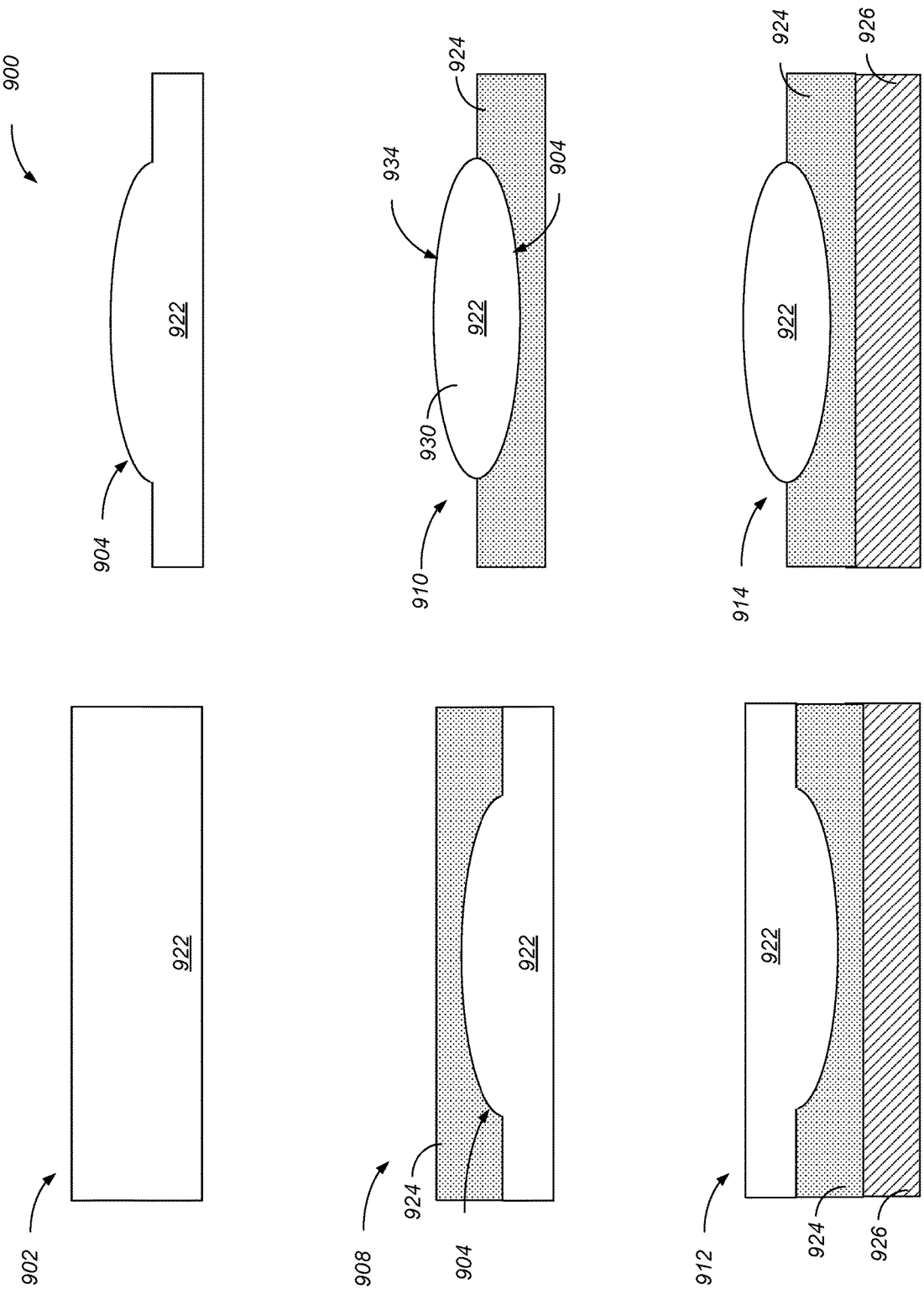
FIG. 9 illustrates a block diagram of an example method for fabricating an optical device, according to implementations of the present disclosure.

FIG. 9 illustrates a block diagram of an example process 900 for fabricating an example optical device, according to the implementations of the present disclosure. The process 900 can be used to fabricate any of the optical devices 100, 200, 210, or other optical devices disclosed herein. The fabricated optical devices can form a photonic integrated circuit that can be attached to or integrated with other forms of optical devices.

The process 900 includes forming a first curved surface 904 on a substrate 902. The substrate 902 can be a semiconductor wafer, or a semiconductor on insulator (SOI) wafer. The first curved surface can be formed by removing or adding semiconductor material to the substrate 902. Semiconductor material can be deposited on the substrate 902 and then patterned by lithography processes. Semiconductor material can also be removed from the substrate 902 to form the first curved surface. For example, the substrate 902 can be etched to remove semiconductor material. Etching techniques such as dry etching, wet etching, or any other suitable etching techniques may be used to form the first curved surface. For example, gray scale mask can be used to etch the substrate 902 and form the curved surface 904. For example, the substrate 902 can be etched through lithography process with controlled ultraviolet dosage to vary the etching depth.

The semiconductor material 922 of the substrate 902 can have a predetermined bandgap energy. The bandgap energy of the semiconductor 922 helps the optical device to transmit (or refract) incident electromagnetic radiation having wavelengths in a first range of wavelengths, and absorb electromagnetic radiation having wavelengths in a second range of wavelengths. In some implementations, the first range of wavelengths is longer than 700 nm (e.g., infrared radiations). For example, the semiconductor 922 may have a bandgap energy between 1.2 electronvolt (eV) and 1.7 eV. In some examples, the semiconductor 922 transmits wavelengths longer than 940 nm. In some implementations, the second range of wavelengths is shorter than 800 nm. For example, the semiconductor 922 may have a bandgap wavelength between 400 nm and 800 nm. The bandgap wavelength can be calculated by the equation (1) noted above.

A bonding layer 924 is deposited on the first curved surface 904 (see structure 908). The bonding layer can form at least part of the optical medium 107 with reference to FIG. 1A. The bonding layer can be deposited on the first curved layer through a thin film deposition techniques such as chemical vapor deposition, plasma-enhanced chemical vapor deposition, sputtering, or any other suitable thin film deposition techniques. The bonding layer can be a semiconductor material, an oxide, a nitride, a metal, or a combination thereof. The bonding layer may transmit all wavelengths refracted by the semiconductor material 922, or may absorb part of such wavelengths.

In some implementations, the bonding layer 924 has an optical thickness corresponding to the focal length of the optical device. For example, the optical thickness of the bonding layer (e.g., optical medium 203 in FIG. 2A) can be sufficient so that electromagnetic radiation refracted by the refractive element (e.g., 201) is focused to a particular spot (e.g., to the active element 207). The optical thickness of the bonding layer can be determined based on thickness and refractive index of the bonding layer. Thickness of the bonding layer can depend on radius of curvature of the first curved surface (and/or a second curved surface). As such, the bonding layer can be set to have a particular thickness.

To reach the particular thickness for the bonding layer, the deposition process can be set to deposit a layer with a predetermined thickness. To adjust the thickness of bonding layer, the bonding layer can also be planarized or polished, for example, by chemical mechanical planarization (CMP). For example, the bonding layer can be rubbed by a pad and an abrasive and/or corrosive chemical slurry to reach a desired thickness. Depending on the initial thickness and the desired thickness of the bonding layer, the rubbing process can be performed at a particular speed, and over a particular time period. In addition, any irregular topography on the surface of the bonding layer can be evened out through planarization. Irregular topography on the surface of the bonding layer can cause inadvertent diffraction or scattering of the electromagnetic radiations into or out of the optical device. An even bonding layer can improve consistency in refraction and/or filtering of electromagnetic radiations over the cross section of the optical device.

In some implementations, a second curved surface 934 is formed on the semiconductor material 922, opposite the first curved surface 904. Same techniques explained above for forming the first curved layer can be used for forming the second curved surface. The first and the second cured surfaces can be symmetrical, or can have different shapes. The first and the second surfaces can have the same radius of curvature or can have different radius of curvatures. In some implementations, the optical device is fabricated for a target focal length. In some examples, the second curved surface is formed so that the second curved surface collectively with the first curved surface provides the target focal length. In some examples, the second curved surface is formed so that the second curved surface collectively with the first curved surface and the bonding layer provides the target focal length.

The resulting optical device 910 includes a refractive element 930 formed by the semiconductor material 922, and a bonding layer 924. The refractive element 930 is formed by the first curved surface and the second curved surface. Alternatively, a refractive element can have only one curved surface (e.g., the refractive element 101). The refractive element 930 can be released from the bonding layer 924 to form an individual lens for later attachment to, for example, a photonic integrated circuit. For example, if the bonding layer 924 is composed of oxide and/or nitride, the bonding layer can be etched from the optical device by a wet etch process, for example, by hydrofluoric acid (HF), ammonium fluoride (NH4H), or a combination thereof.

In some implementations, the refractive element can include one or more substructures, such as the substructures 123 in FIG. 1B. In some implementations, the substructures can be formed on another semiconductor substrate and bonded to the refractive element and/or the bonding layer. For example, the substructure portion 123 can be formed by etching a semiconductor substrate, and can be bonded to a refractive element (e.g., the lens portion 121).

In some implementations, the substructures are formed on the refractive element. Substructures can be formed by selectively etching one or both of the first curved surface 904 and/or the second curved surfaces 934. The substructures can be left unfilled, or can be filled with a material different from the semiconductor material of the substrate 922. In some examples, a group of the substructures are filled with a material with higher refractive index than the refractive index of the substrate 922 to provide a guided mode in the optical device. The substructures can also be formed by thin film deposition. For example, a mask can be used for depositing periodic patterns, gratings, or photonic crystals on a respective curved surface to form a group of substrucutres. The deposited substructures can be composed of the same material as the refractive element 930, or can be composed of a material different from the refractive element 930. For example, the substructures can be composed of a semiconductor material (e.g., silicon), or nitride, or oxide, or a combination thereof. In some examples, more than one mask is used to deposit different materials for the substructures. For example, a first mask may be used to deposit a semiconductor material, and a second mask may be used to deposit a nitride material. The semiconductor and the nitride substrates can form alternating gratings. One or more substructures can be formed to have at least one dimension less than bandgap wavelength of the refractive element 930.

As discussed earlier with reference to FIG. 2, an optical device can be attached to, or integrated with an optical element. The optical element can be arranged relative to the bonding layer 924 so that the optical device receives electromagnetic radiation refracted by the optical element. The optical element can be arranged relative to the refractive element 930 so that the optical element transmits electromagnetic radiation into the optical device. The optical element can be configured to tune a first range of wavelengths that the optical device refracts, and/or a second range of wavelengths that the optical device absorbs. A wavelength tuning can include absorbing or emitting electromagnetic radiation in a respective tuned range of wavelengths.

The optical element attached to the optical device may also be an active optical element. An active optical element may be an active optical component that transmits, modulates, switches, or absorbs light. For example, an active optical element can be a photodetector configured to absorb at least a portion of the light refracted by the optical device to measure optical power of one or more wavelengths. Other examples of the active optical element include, but are not limited to, a sensor, a photo emitting diode, and a laser. The active optical element may be composed of one or more layers of silicon, germanium, tin, or III-V compounds.

The optical element attached to the optical device can be a second optical device. A combination of the first and the second optical elements can provide more flexibility in refraction and/or filtration of incident electromagnetic radiation. For example, the first optical device may refract incident electromagnetic radiation having a first range of wavelengths and/or filters electromagnetic radiation having wavelengths in a second range of wavelengths. The first optical device and the second optical device can be configured to collectively refract incident electromagnetic radiation having wavelengths in a third range of wavelengths and/or filter electromagnetic radiation having wavelengths in a fourth range of wavelengths. The third range of wavelengths can be a subrange of the first range of wavelengths. The fourth range of wavelengths can be a subrange of the second range of wavelengths. Each of the first optical device and the second optical device can have a refractive element. A refractive element can have one or more curved surfaces and/or one or more substructures. The one or more substructures can include a group of the substructures that are arranged periodically. A group of the substructures can be subwavelength structures. At least one subwavelength structure of the first and/or the second optical element can have at least one dimension (e.g., a diameter) smaller than the bandgap wavelength of refractive element of the first and/or the second optical device. For example, the second refractive element can have subwavelength structures with at least one dimension smaller than bandgap wavelength of the first refractive element.

An optical element can be integrated with a first optical device during fabrication of the first optical device. For example, in 912, the optical element 926 is bonded to the bonding layer 924 of the structure 912. The structure 908 includes a refractive element with a first curved surface. After bonding the optical element 926, the structure can further be fabricated to form a refractive element with two curved surfaces (e.g., refractive element 930). Alternatively, an optical element can be bonded to an optical device anytime after completion of fabrication of the optical device. For example, in 914, the 926 is bonded to the optical device 910. The active element can be bonded to the optical device via various bonding processes including hybrid metal/dielectric wafer bonding technique, metal eutectic bonding technique, oxide-oxide bonding technique, or use polymer or other adhesive and viscous materials to attach the active element with the optical device, particularly when there is curvature on the optical device or active element The optical element 926 can be an active optical element, or can be a second optical device. The optical element 926 can be a semiconductor structure that can form part of the optical medium 107. The optical element 926 can also be a semiconductor substrate used to fabricate another optical element or device. For example, the optical element 926 can be a carrier wafer, on which a second optical device can be fabricated.

The optical element 926 can be coupled with the refractive element 930, or with the bonding layer 924. In some implementations, the optical element 926 is coupled (or bonded) to the optical device through a second bonding element. For example, a second bonding layer may be formed on the second curved surface 934 of the optical device 910, and the second optical element can be coupled to the second bonding layer, opposite the first optical device 910. The second bonding layer can have a sufficient optical thickness so that electromagnetic radiation refracted by the first optical device is focused to the second optical device. The second bonding layer can also be designed such that the electromagnetic radiation refracted by the first optical device is focused on a particular spot of the second optical device. For example, the second bonding layer may guide the electromagnetic radiation refracted by the first optical device to a particular spot on the second optical device, where subwavelength structures are located.

In some implementations, the optical element 926 is embedded inside the refractive element 930. In some examples, the optical element 926 can be embedded inside one or more substructures of the refractive element 930. For example, one or more substructures may be filled with semiconductor materials capable of sensing, transmitting, or absorbing a predetermined range of wavelengths. For example, one or more substructures may be filled with silicon germanium (SiGe) to be used as photodetector to measure optical power of one or more wavelengths that are refracted by the optical device. The composition of the SiGe can range from only a small amount of germanium (Ge), to 100% Ge. Depending on the percentage of Ge, the bandgap energy of the SiGe changes and different wavelengths can be detected.

The curvature of the first and/or the second curved surfaces can be formed by the fabrication techniques and/or be induced by a process induced strain as explained with reference to FIG. 5. The curvature of the first and/or the second curved surfaces can also be adjusted dynamically by applying external electric field (to modulate carrier concentrations), excreting mechanical forces (through piezoelectric effect), or using MEMs. FIGS. 6A through 8B provide example techniques to dynamically adjust curvature of a curved surface.

A photonic integrated circuit can include one or more optical devices disclosed in the present disclosure. A photonic integrated circuit with multiple optical devices can be used, for example, for image sensing applications. FIG. 4 provides an example photonic integrated circuit having multiple refractive elements for filtering different wavelengths of light. Similarly, a photonic integrated circuit can be formed having multiple optical devices. Each of the optical devices may have one or more refractive elements and/or one or more substructures to filter and/or refract different wavelengths of lights. Different optical devices may have different sizes or forms of refractive elements. Different optical devices can be fabricated by applying different masks, depositing different material, depositing different thickness of layers, and/or etching different patterns of photonic crystal patterns, gratins, or other periodic substructures. For example, refractive elements in two or more of the regions can have the same or different radius of curvature. In some implementations, one or more optical devices of a photonic integrated circuit may have no refractive elements and may include only substructures. The substructures may be formed by different periods, sizes, materials. The substructures may be formed on a single substrate. The substrate may be planar to may be have an overall curvature. In some examples, a photonic integrated circuit may form a pixel, and each optical device may form a sub-pixel capable of transmitting a particular range of wavelength.

Figure 10:
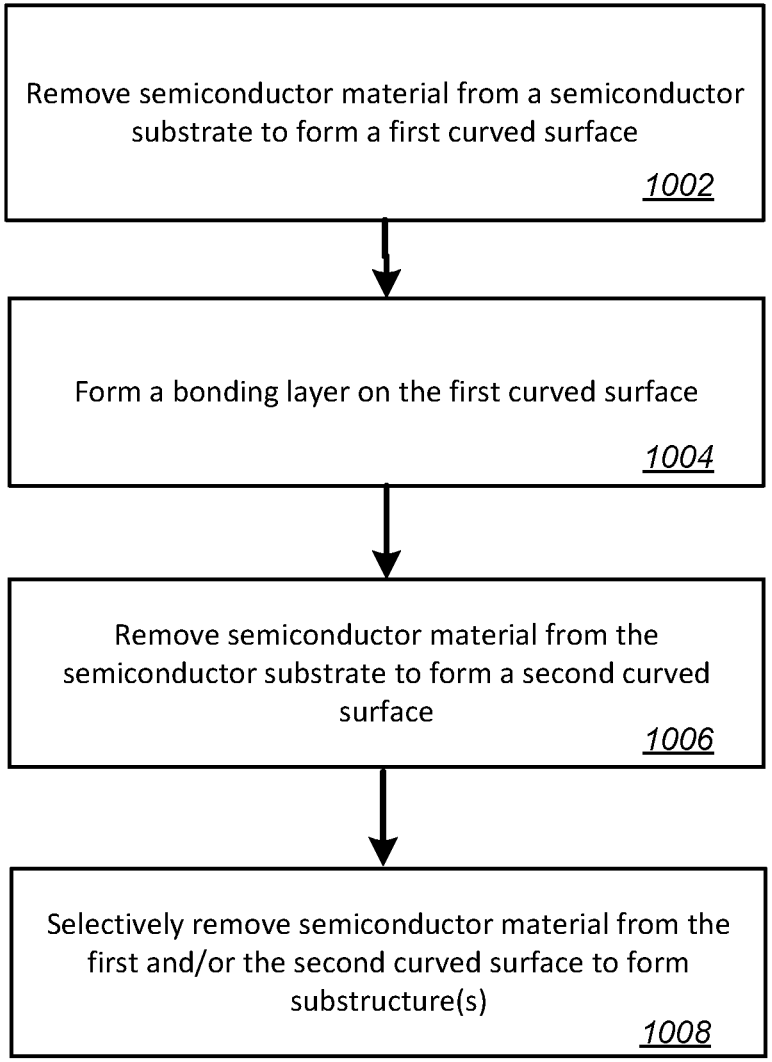
FIG. 10 depicts a flow diagram for an example method of fabricating an optical device, according to implementations of the present disclosure.

FIG. 10 depicts a flow diagram for an example process 1000 of fabricating an optical device, according to implementations of the present disclosure. The process 1000 may be used to fabricate the optical device 910 in FIG. 9. The process 1000 may occur in the illustrated sequence, or it may occur in a sequence that is different than in the illustrated sequence. Some of the steps in the process 1000 may be optional. The process 1000 may be performed by a system including data processing apparatus, such as one or more computers that control one or more apparatuses that perform the fabrication steps.

Process 1000 may be performed by using one or more lithography, etching, and/or thin film deposition techniques. For example, lithography techniques such as projection lithography, electronic-beam lithography, contact lithography, or any other suitable lithography techniques may be used to form an optical device. Etching techniques such as dry etching, wet etching, or any other suitable etching techniques may be used to fabricate parts of the optical device. Thin film deposition techniques such as chemical vapor deposition, plasma-enhanced chemical vapor deposition, sputtering, or any other suitable thin film deposition techniques may be used to deposit one or more layers of materials on the optical device.

According to process 1000, semiconductor material is removed from a semiconductor substrate to form a first curved surface (1002). The first curved surface forms a surface of a refractive element (e.g., refractive element 930 in FIG. 9) of the optical device. For example, the substrate 902 can be etched to form the first curved surface 904. The first curved surface can be formed based on a predetermine radius of curvature. The radius of curvature can depend on refractive index of the semiconductor material and/or a desired effective refractive index of the optical device. Examples of the semiconductor substrate include, but are not limited to, a silicon wafer, or a silicon-on-insulator wafer. The first curved surface can be formed by using a grayscale mask. The first curved surface can also be formed by process induced strains. Curvature of the first curved surface can also be dynamically adjusted by applying an external electric field, excreting a mechanical force, and/or using MEMS.

A bonding layer is formed on the first layer (1004). For example, the bonding layer can be deposited on the first layer by a thin film deposition technique. For example, the bonding layer 924 is deposited on the first curved surface 904 of structure 908 in FIG. 9. Optical thickness of the bonding layer can correspond to focal point of the refractive element of the optical device. For example, refractive index and/or thickness of the bonding layer may be set so that the optical device focus (or defocus) the refracted electromagnetic radiation in predetermined spots.

Semiconductor material is removed from the semiconductor substrate to form a second curved surface (1006). For example, semiconductor material 922 in 908 is etched to form a second curved surface 934 in 910. The second curved surface can be formed by the same techniques, or by different techniques used for forming the first curved surface. The second curved surface can be formed by gray scale mask, or by a process induced strain. The second curved surface can be formed based on a predetermine radius of curvature. The radius of curvature can depend on refractive index of the semiconductor material and/or a desired effective refractive index of the optical device. Curvature of the second curved surface can be dynamically adjusted by applying an external electric field, excreting a mechanical force, and/or using MEMS.

The first and the second curved surfaces can be symmetrical, or can have different shapes. The first and the second curved surfaces can have the same focal lengths, or can have different focal lengths. The first and the second curved surface form two surfaces of a refractive element of the optical device. In some implementations, the refractive element is set to have a predetermined focal length. In some examples, radius of curvature of the first and/or the second curved surfaces are determined based on the focal length of the refractive element.

Semiconductor material is selectively removed from the first and/or the second curved surfaces to form substructure(s) (1008). For example, the substructures 105 are formed on the refractive element 101 by etching selected areas of the refractive element 101. A group of substructures can be arranged periodically. Two or more substructures can have different shapes and/or sizes. For example, the periodic substructures 125 have different size from the periodic substructures 127. One or more substructures can have at least one subwavelength dimension. A subwavelength dimension is less than the bandgap wavelength of the semiconductor material that forms the refractive element. For example, the substructures 127 may have a subwavelength diameter. One or more substructures can be filled with a material different from the semiconductor material of the refractive element. For a guided mode resonance effect, the refractive index of the filling material can be higher than the refractive index of the refractive element.

Other embodiments are in the following claims.

What is claimed is:

1. A method for fabricating an optical device, the method comprising:
   removing semiconductor material from a semiconductor substrate to form a first curved surface of the optical device, the semiconductor substrate having a bandgap wavelength associated with a bandgap energy of the semiconductor material;
   forming a bonding layer on the first curved surface, wherein forming the bonding layer comprises depositing bonding material on the first curved surface;
   removing semiconductor material from the semiconductor substrate to form a second curved surface of the optical device, the second curved surface being formed opposite the first curved surface of the optical device; and
   selectively removing semiconductor material from at least one of the first curved surface and the second curved surface of the optical device to form one or more subwavelength structures, wherein at least one subwavelength structure has at least one dimension smaller than the bandgap wavelength of the semiconductor substrate;

wherein the optical device is configured to refract incident electromagnetic radiation having wavelengths in a first range of wavelengths and/or to filter electromagnetic radiation having wavelengths in a second range of wavelengths, the first range of wavelengths being infrared wavelengths longer than the bandgap wavelength and the second range of wavelengths being shorter than the bandgap wavelength.

2. The method of claim 1, wherein the bandgap energy of the semiconductor material is 1.2 eV to 1.7 eV.

3. The method of claim 1, wherein the first range of wavelengths is from 800 nm to 2,000 nm.

4. The method of claim 1, wherein the second range of wavelengths is from 400 nm to 800 nm.

5. The method of claim 1, wherein the optical device is a lens.

6. The method of claim 1, further comprising arranging an optical element relative to the bonding layer so that the optical element receives electromagnetic radiation refracted by the optical device.

7. The method of claim 6, wherein the optical element is an active element configured to tune the first range of wavelengths and/or the second range of wavelengths, wherein tuning comprises absorbing or emitting electromagnetic radiation in a respective tuned range of wavelengths.

8. The method of claim 6, wherein the optical element is selected from the group consisting of: a photodetector, a sensor, a light emitting diode, and a laser.

9. The method of claim 6, wherein the optical element comprises SiGe.

10. The method of claim 1, further comprising forming one or more structures on the second curved surface of the optical device, the one or more structures form an optical element selected from the group consisting of: a photodetector, a sensor, a photo emitting diode, and a laser.

11. The method of claim 1, wherein the optical device is a first optical device and the bonding layer is a first bonding layer, and the method further comprises:
 forming a second bonding layer on the second curved surface of the first optical device by depositing bonding material on the second curved surface; and
 coupling a second optical device to the second bonding layer and opposite the first optical device;
 wherein the first optical device and the second optical device are configured to collectively refract incident electromagnetic radiation having wavelengths in a third range of wavelengths and/or to filter electromagnetic radiation having wavelengths in a fourth range of wavelengths, wherein the third range of wavelengths is a subrange of the first range of wavelengths and/or the fourth range of wavelengths is a subrange of the second range of wavelengths.

12. The method of claim 11, wherein the second optical device comprises at least one curved surface that includes one or more subwavelength structures, wherein at least one subwavelength structure has at least one dimension smaller than the bandgap wavelength of the semiconductor substrate.

13. The method of claim 11, wherein the second bonding layer has an optical thickness sufficient so that electromagnetic radiation refracted by the first optical device is focused to the second optical device.

14. The method of claim 1, wherein the second curved surface has same radius of curvature as the first curved surface.

15. The method of claim 1, wherein at least one of the first curved surface and the second curved surface is formed by using a grayscale mask.

16. The method of claim 1, wherein removing the semiconductor material from the semiconductor substrate comprises etching the semiconductor substrate.

17. The method of claim 1, wherein the one or more subwavelength structures comprise a plurality of subwavelength structures arranged periodically.

18. The method of claim 1, wherein the bonding layer comprises a bonding material selected from the group consisting of: an oxide, a nitride, and a metal.

19. The method of claim 1, wherein forming the bonding layer further comprises planarizing the bonding layer through chemical-mechanical planarization.

20. The method of claim 1, wherein the optical device has an effective refractive index that is dynamically adjustable in response to applying an electric field.

21. The method of claim 1, wherein the bonding layer has an optical thickness corresponding to a focal length of the optical device.

* * * * *